(12) United States Patent
Chen et al.

(10) Patent No.: US 11,854,863 B2
(45) Date of Patent: Dec. 26, 2023

(54) SEMICONDUCTOR DEVICE INCLUDING AN ISOLATION REGION HAVING AN EDGE BEING COVERED AND MANUFACTURING METHOD FOR THE SAME

(71) Applicant: TAIWAN SEMICONDUCTOR MANUFACTURING COMPANY LTD., Hsinchu (TW)

(72) Inventors: Te-An Chen, Taichung (TW); Meng-Han Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 41 days.

(21) Appl. No.: 17/357,828

(22) Filed: Jun. 24, 2021

(65) Prior Publication Data

US 2022/0415706 A1    Dec. 29, 2022

(51) Int. Cl.
*H01L 21/762* (2006.01)
*H01L 21/765* (2006.01)
*H01L 27/088* (2006.01)
*H01L 29/40* (2006.01)
*H01L 29/66* (2006.01)
(Continued)

(52) U.S. Cl.
CPC ...... *H01L 21/76224* (2013.01); *H01L 21/765* (2013.01); *H01L 27/088* (2013.01); *H01L 29/401* (2013.01); *H01L 29/405* (2013.01); *H01L 29/66636* (2013.01)

(58) Field of Classification Search
CPC ....... H01L 21/82345; H01L 21/823456; H01L 21/823437; H01L 21/823842; H01L 21/82385; H01L 21/28123–28141; H01L 21/823468; H01L 21/823864; H01L 29/51; H01L 21/823814; H01L 21/823481; H01L 21/823878; H01L 29/0649–0653; H01L 29/0603; H01L 29/0607; H01L 29/0638; H01L 21/76224; H01L 21/765; H01L 27/088; H01L 29/165; H01L 29/7848; H01L 29/405; H01L 29/665; H01L 29/0843–0891; H01L 29/66636–66643; H01L 21/823418–823425; H01L 29/66575–66598; H01L 29/66515; H01L 21/0273–0279; H01L 21/312–3128; H01L 27/092; H01L 27/0207; H01L 21/823828; H01L 29/785; H01L 21/823431; H01L 27/0886; H01L 29/66795
See application file for complete search history.

(56) References Cited

U.S. PATENT DOCUMENTS 8,350,253 B1 * 1/2013 Zhu ................. H01L 21/823814
                                                        257/19
9,362,402 B2 * 6/2016 He .................... H01L 29/66636
(Continued)

*Primary Examiner* — Sonya McCall-Shepard
(74) *Attorney, Agent, or Firm* — WPAT LAW; Anthony King

(57) ABSTRACT

The present disclosure provides a semiconductor device, including a substrate, a first active region in the substrate, a second active region in the substrate and adjacent to the first active region, an isolation region in the substrate and between the first active region and the second active region, and a dummy gate overlapping with the isolation region, wherein an entire bottom width of the dummy gate is greater than an entire top width of the isolation region.

20 Claims, 25 Drawing Sheets

(51) Int. Cl.
*H01L 21/8234* (2006.01)
*H01L 21/8238* (2006.01)
*H01L 27/092* (2006.01)
*H01L 27/02* (2006.01)
*H01L 29/165* (2006.01)
*H01L 29/78* (2006.01)

(56) References Cited

U.S. PATENT DOCUMENTS

| | | | |
|---|---|---|---|
| 2009/0166755 A1* | 7/2009 | Chakravarthi | H01L 21/823864 438/303 |
| 2013/0328127 A1* | 12/2013 | Chen | H01L 29/7848 257/E21.409 |
| 2015/0115373 A1* | 4/2015 | Yu | H01L 29/66545 438/283 |
| 2017/0103981 A1* | 4/2017 | Hung | H01L 29/0649 |
| 2017/0271503 A1* | 9/2017 | Yu | H01L 29/7842 |
| 2018/0006135 A1* | 1/2018 | Shen | H01L 29/0653 |
| 2018/0122704 A1* | 5/2018 | Zhou | H01L 27/0886 |
| 2021/0408254 A1* | 12/2021 | Kim | H01L 29/66545 |

* cited by examiner

SEMICONDUCTOR DEVICE INCLUDING AN ISOLATION REGION HAVING AN EDGE BEING COVERED AND MANUFACTURING METHOD FOR THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency.

When a semiconductor device such as metal-oxide-semiconductor field-effect-transistor (MOSFET) is scaled down through various technology nodes, device packing density and device performance are challenged by leakage issue. An improved approach for alleviating leakage issue and enhancing device performance is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
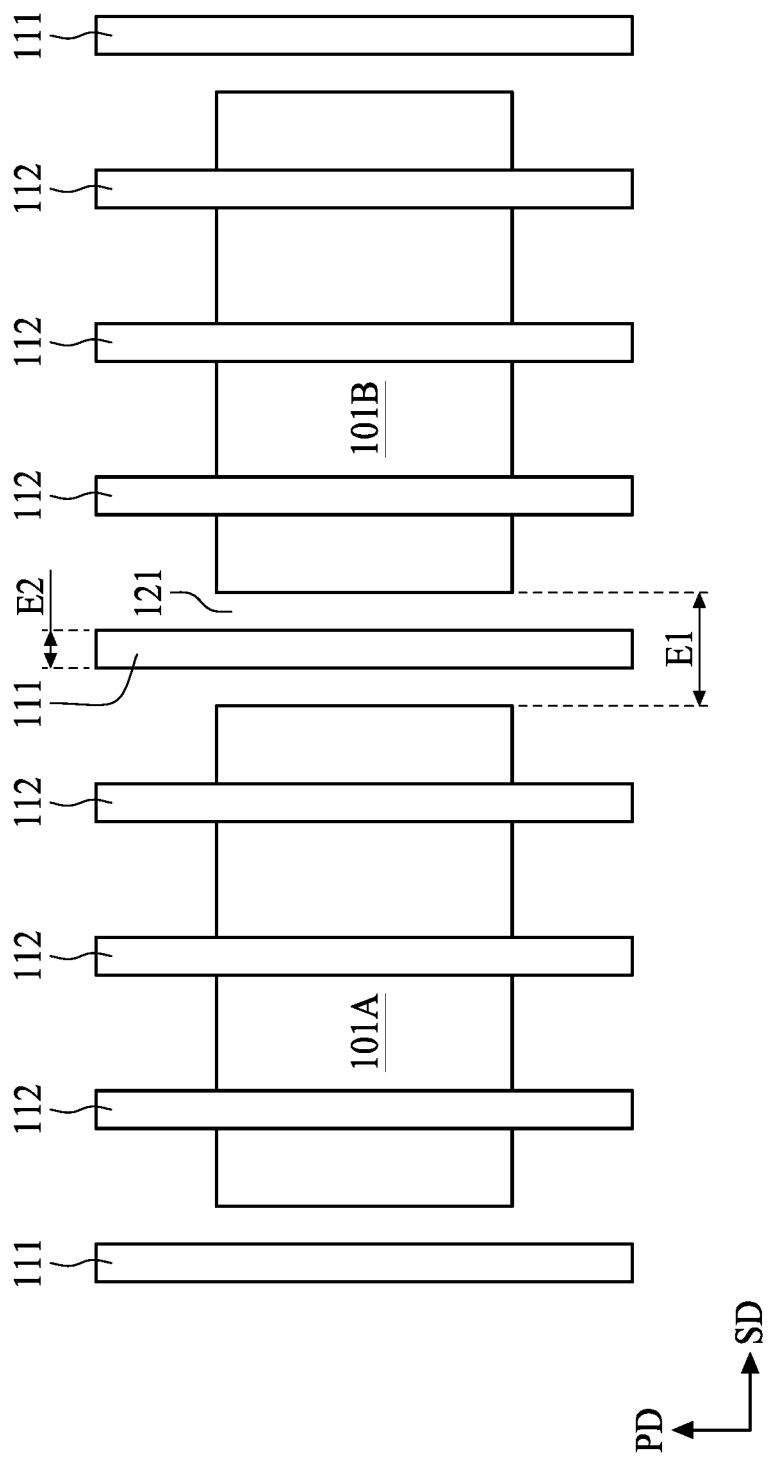
FIG. 1A is a schematic drawing illustrating a top view perspective of a semiconductor device, in accordance with a comparative embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1B:
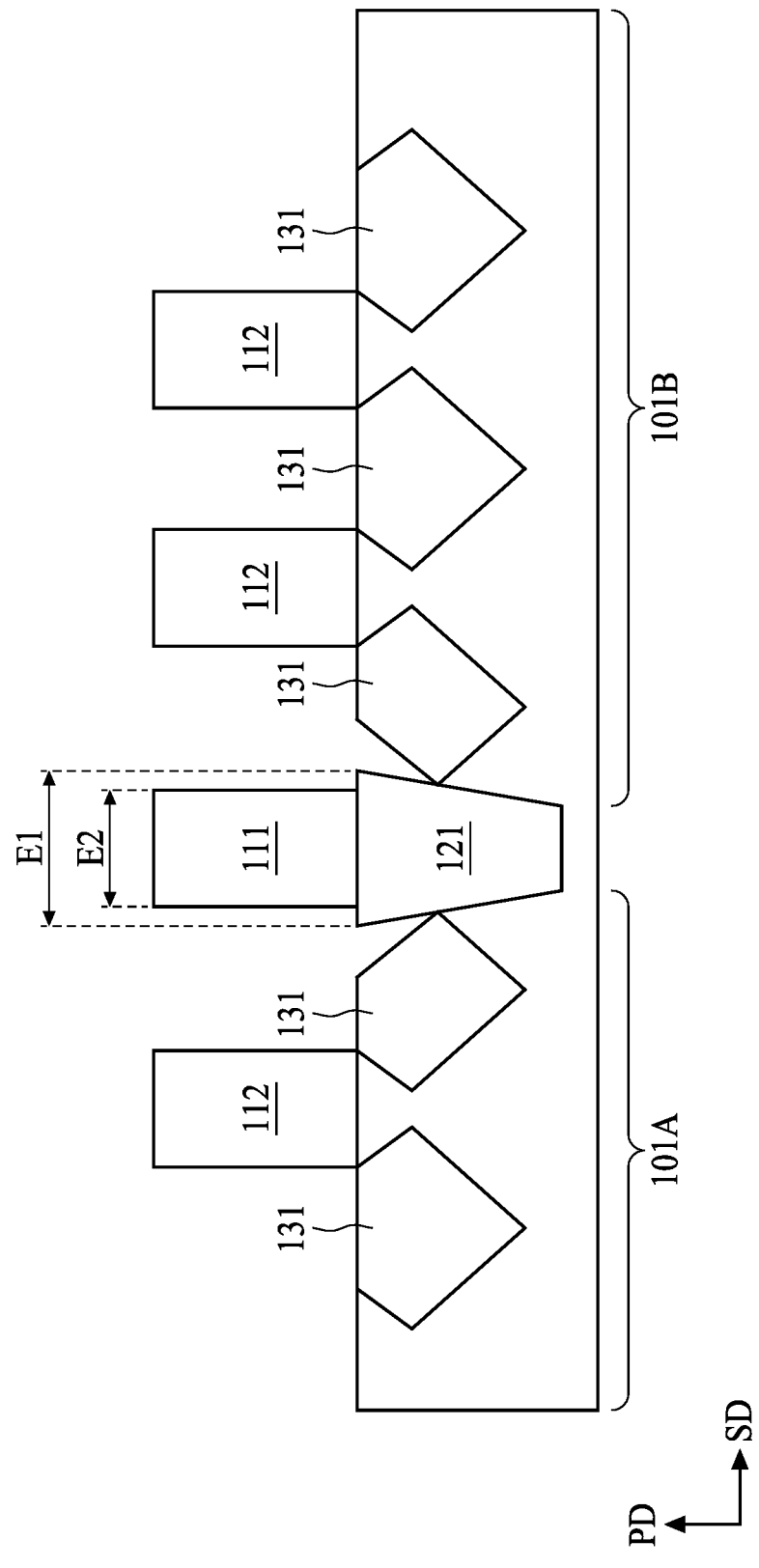
FIG. 1B is a schematic drawing illustrating a cross sectional view of a semiconductor device, in accordance with a comparative embodiment.

Referring to FIG. 1A and FIG. 1B, FIG. 1A is a schematic drawing illustrating a top view perspective of a semiconductor device, FIG. 1B is a schematic drawing illustrating a cross sectional view of a semiconductor device, in accordance with a comparative embodiment. The semiconductor device 100 includes a first active region 101A and a second active region 101B adjacent to the first active region 101A. The first active region 101A and the second region 101B are separated by an isolation region 121. A dummy gate 111 extending along a primary direction PD is directly above the isolation region 121, wherein a width E1 along a secondary direction SD (substantially perpendicular to the primary direction PD) of the isolation region 121 between the first active region 101A and the second region 101B is greater than a width E2 along the secondary direction SD of the dummy gate 111, and a portion of the isolation region 121 is exposed from the dummy gate 111 from a top view perspective. The dummy gate referred herein can be a structure similar to an active gate 112 but without connection to external bias. In some embodiments, the dummy gate 111 is directly disposed on the isolation region 121 without contacting the epitaxial features 131.

However, during the operation of epitaxial growth, it is easier for the epitaxial material to be formed on a silicon surface than a dielectric surface, for example, a surface of the isolation region 121. Therefore, in such comparative embodiment, (1) the epitaxial features 131 adjacent to the isolation region 121 may not be properly formed since the epitaxial growth at the vicinity of the isolation region will be retarded, and the volume of the formed epitaxial features 131 may be less than desired. The volume of the epitaxial features 131 is related to device performance, thus, the problem of epitaxial growth in the comparative embodiment of semiconductor device 100 may lead to worse device performance. Furthermore, (2) the asymmetric physical shape may lead to asymmetric electrical properties over the entire epitaxial features 131; (3) a height of the epitaxial features 131 adjacent to the isolation region 121 may be lower than the other epitaxial features 131, and a conductive contact formed thereabove (not shown in FIG. 1A to FIG. 1B) may not be properly contacting the epitaxial features 131 adjacent to the isolation region 121; and (4) when performing an implanting operation (for example, source/drain pickup implant), some dopant that should be implanted in the epitaxial features 131 may end up being implanted into silicon layer surrounding the epitaxial features 131 and residing in the active regions 101A or 101B, and such phenomenon may cause leakage issue due to undesired dopant distribution.

Figure 2:
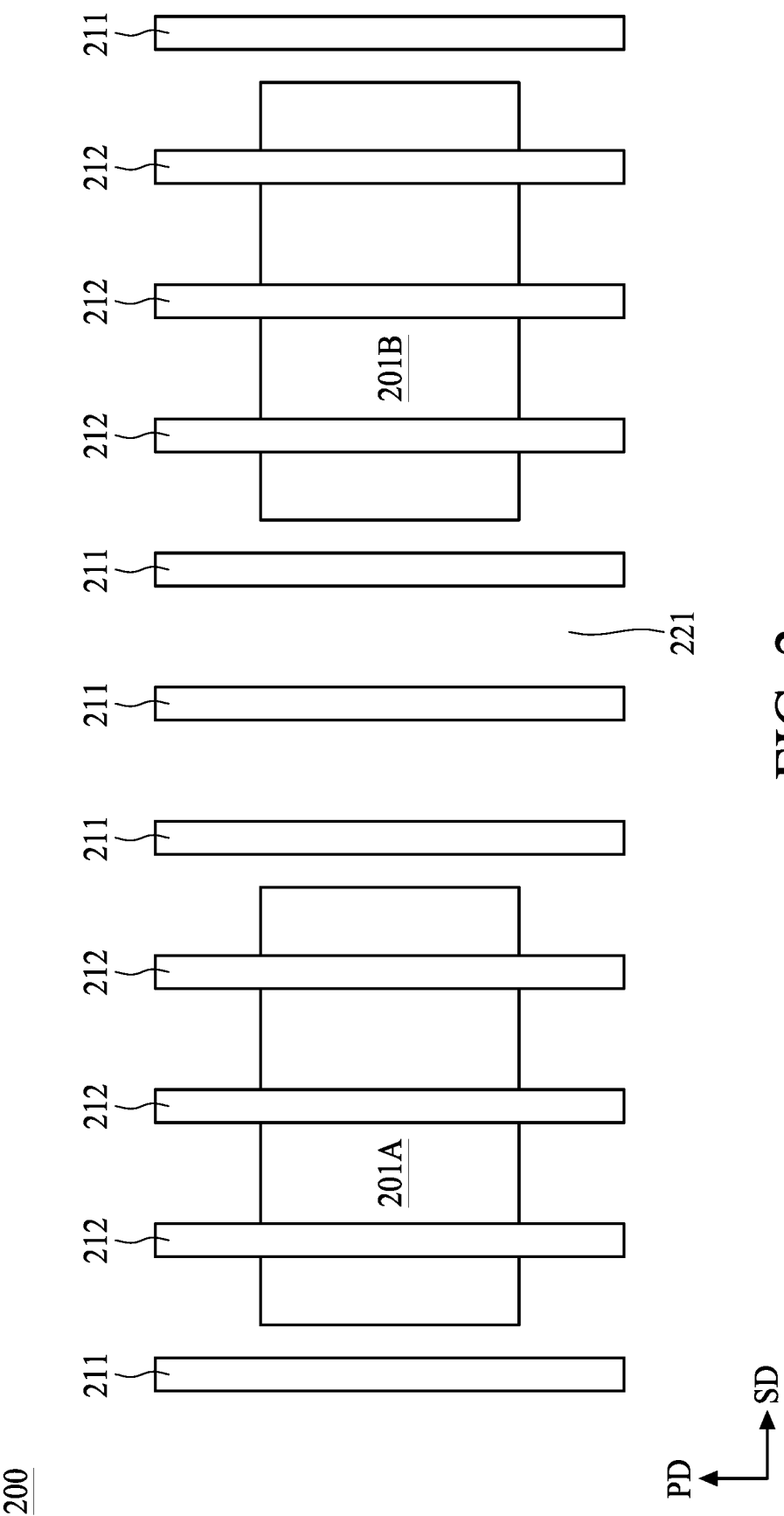
FIG. 2 is a schematic drawing illustrating a top view perspective of a semiconductor device, in accordance with a comparative embodiment.

Referring to FIG. 2, FIG. 2 is a schematic drawing illustrating a top view perspective of a semiconductor device, in accordance with a comparative embodiment. The semiconductor device 200 includes a first active region 201A and a second active region 201B adjacent to the first active region 201A. The first active region 201A and the second region 201B are separated by an isolation region 221. A plurality of dummy gates 211 extending along a primary direction PD is directly above the isolation region 221, and a portion of the isolation region 221 is exposed from the plurality of dummy gates 211 from a top view perspective. One or more gate(s) 212 is above the active regions 201A, 201B and extending along the primary direction PD.

Similar to the condition discussed in FIG. 1A and FIG. 1B, the semiconductor device 200 may suffer from the aforementioned issue(s) caused by improperly formed epitaxial features adjacent to a dummy gate 211 since an epitaxial feature formed between the dummy gate 211 and the gate 212 may be in direct contact with the isolation region 221.

Figure 3:
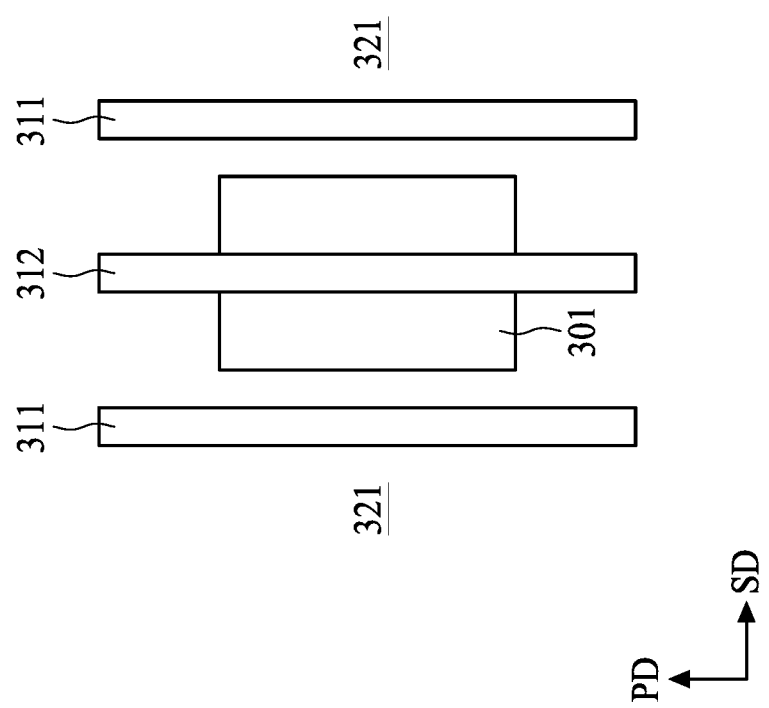
FIG. 3 is a schematic drawing illustrating a top view perspective of a semiconductor device, in accordance with a comparative embodiment.

Referring to FIG. 3, FIG. 3 is a schematic drawing illustrating a top view perspective of a semiconductor device, in accordance with a comparative embodiment. The semiconductor device 300 includes an active region 301, and a plurality of dummy gates 311 and one or more gate(s) 312 extending along a primary direction PD. A portion of the isolation region 321 is exposed from a space between a dummy gate 311 and the active region 301.

Similar to the condition discussed in FIG. 1A and FIG. 1B, the semiconductor device 300 may suffer from the aforementioned issue(s) caused by improperly formed epitaxial features adjacent to a dummy gate 311 since an epitaxial feature formed between the dummy gate 311 and the gate 312 may be in direct contact with the isolation region 321.

The present disclosure provides a semiconductor device and a method for fabricating the semiconductor device to alleviate the leakage issue stem from improperly formed epitaxial features. By virtue of adjusting a configuration of the semiconductor device, the formation of the epitaxial features can be improved and the uniformity of size and/or shape of the epitaxial features, adjacent to or away from a dummy gate, may be improved, therefore the device performance can be improved.

Figure 4:
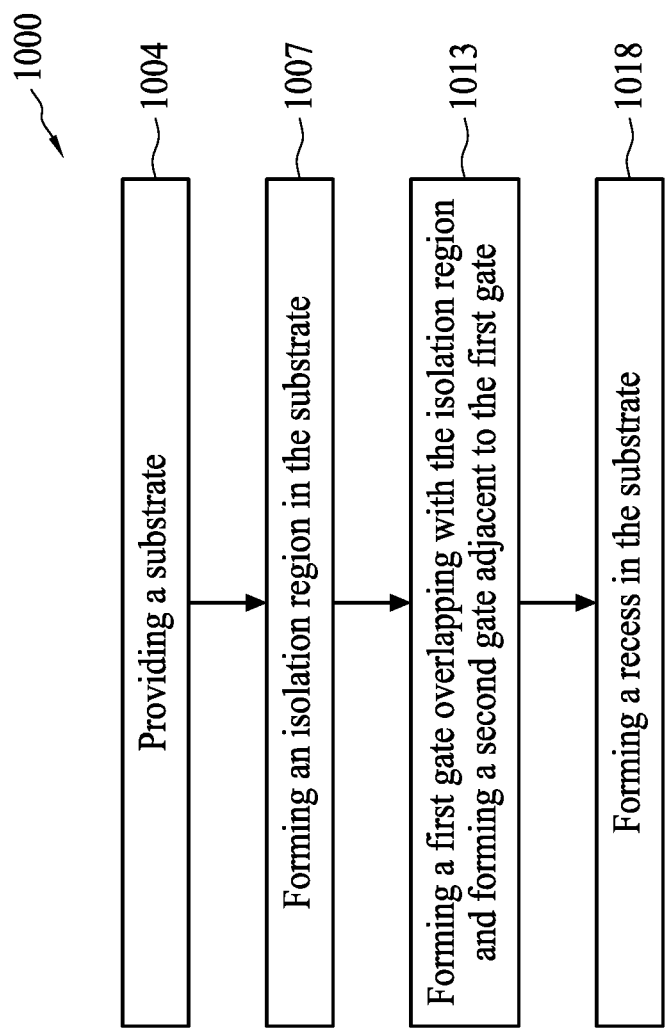
FIG. 4 shows a flow chart representing a method for fabricating a semiconductor device, in accordance with some embodiments of the present disclosure.

Referring to FIG. 4, FIG. 4 shows a flow chart representing a method for fabricating a semiconductor device, in accordance with some embodiments of the present disclosure. The method 1000 for fabricating a semiconductor device includes providing a substrate (operation 1004, which can be referred to FIG. 7A or FIG. 10A), forming an isolation region in the substrate (operation 1007, which can be referred to FIG. 7A or FIG. 10A), forming a first gate overlapping with the isolation region and forming a second gate adjacent to the first gate (operation 1013, which can be referred to FIG. 7A or FIG. 10A), and forming a recess in the substrate (operation 1018, which can be referred to FIG. 7D or FIG. 10D).

Figure 5:
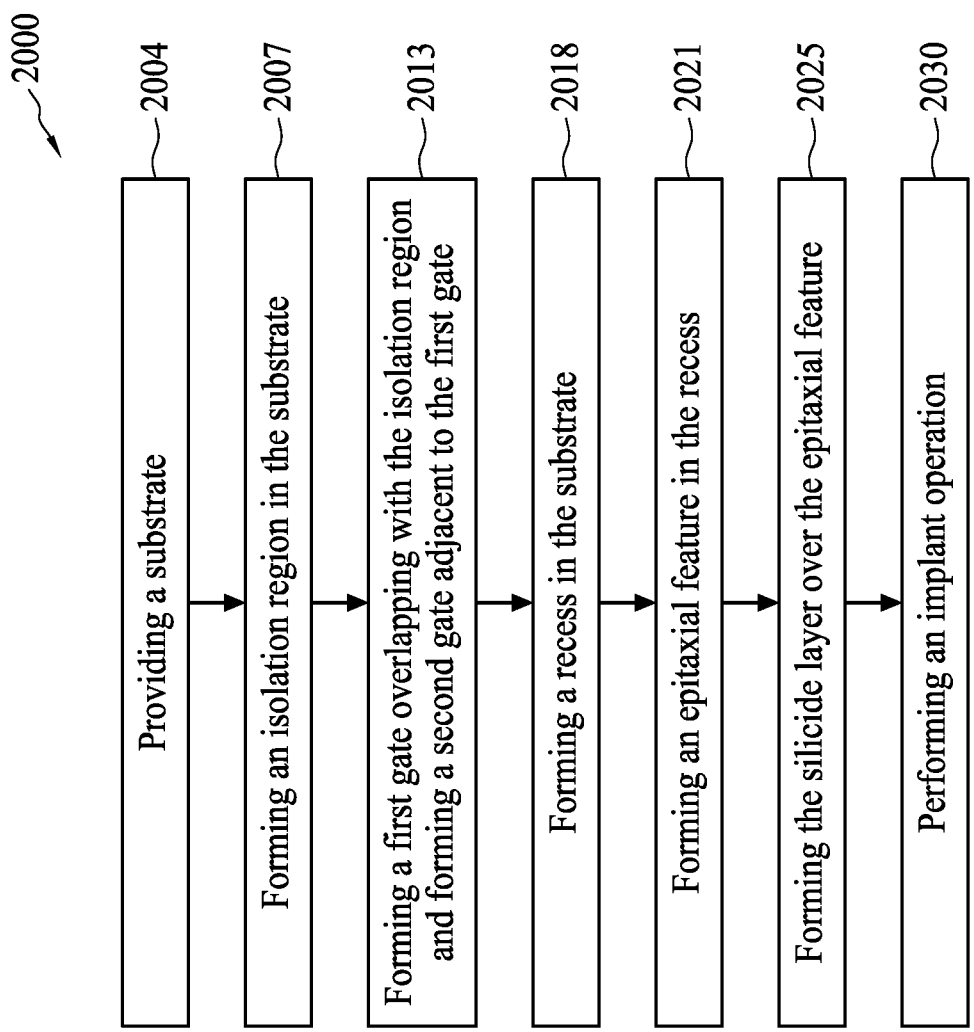
FIG. 5 shows a flow chart representing a method for fabricating a semiconductor device, in accordance with some embodiments of the present disclosure.

Referring to FIG. 5, FIG. 5 shows a flow chart representing a method for fabricating a semiconductor device, in accordance with some embodiments of the present disclosure. The method 2000 for fabricating a semiconductor device includes providing a substrate (operation 2004, which can be referred to FIG. 7A or FIG. 10A), forming an isolation region in the substrate (operation 2007, which can be referred to FIG. 7A or FIG. 10A), forming a first gate overlapping with the isolation region and forming a second gate adjacent to the first gate (operation 2013, which can be referred to FIG. 7A or FIG. 10A), forming a recess in the substrate (operation 2018, which can be referred to FIG. 7D or FIG. 10D), forming an epitaxial feature in the recess (operation 2021, which can be referred to FIG. 7E or FIG. 10E), forming the silicide layer over the epitaxial feature (operation 2025, which can be referred to FIG. 7F or FIG. 10F), and performing an implant operation (operation 2030, which can be referred to FIG. 7F or FIG. 10F).

Figure 6A:
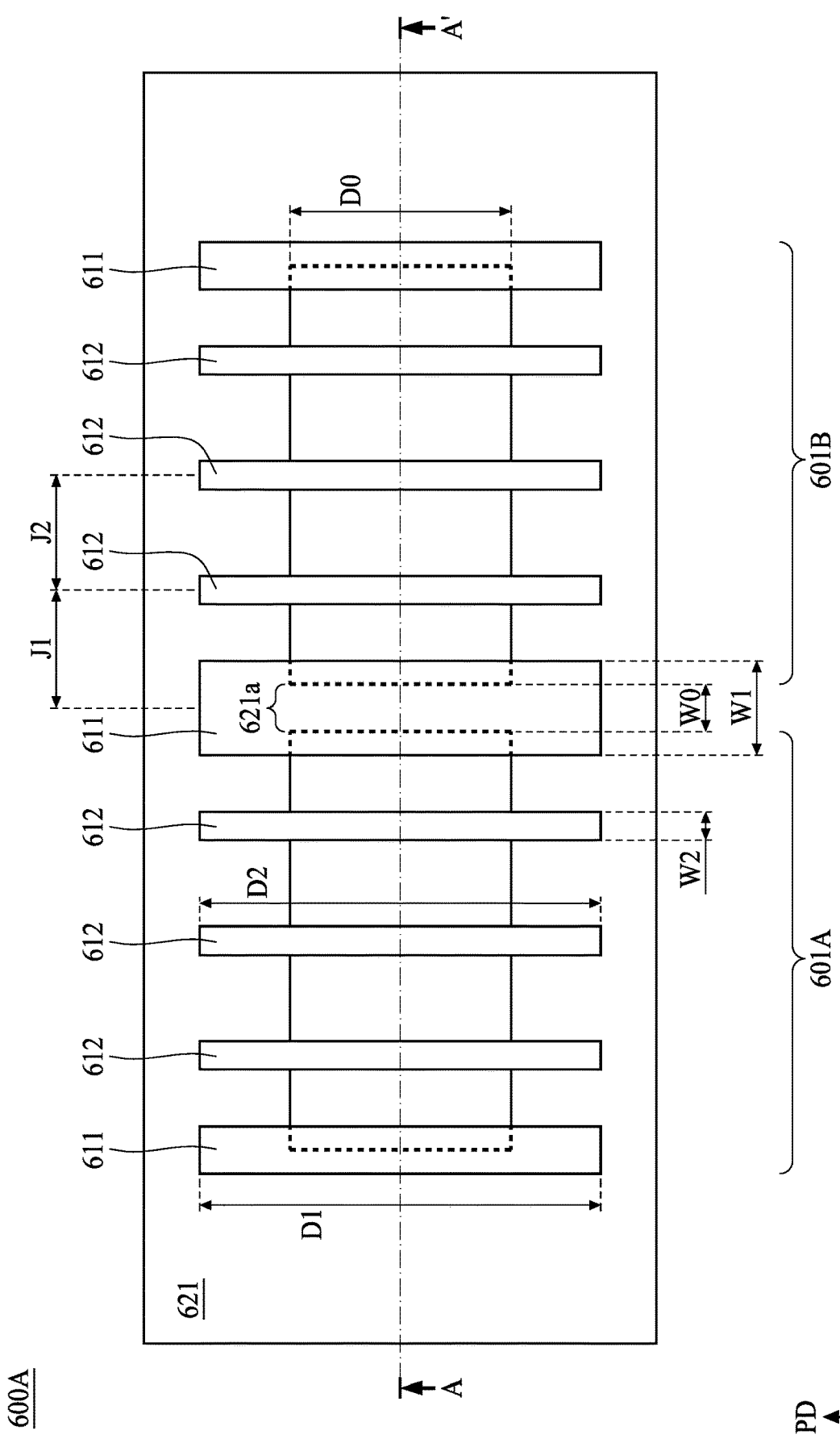
FIG. 6A is a schematic drawing illustrating a top view perspective of a semiconductor device, in accordance with some embodiments of the present disclosure.
Figure 6B:
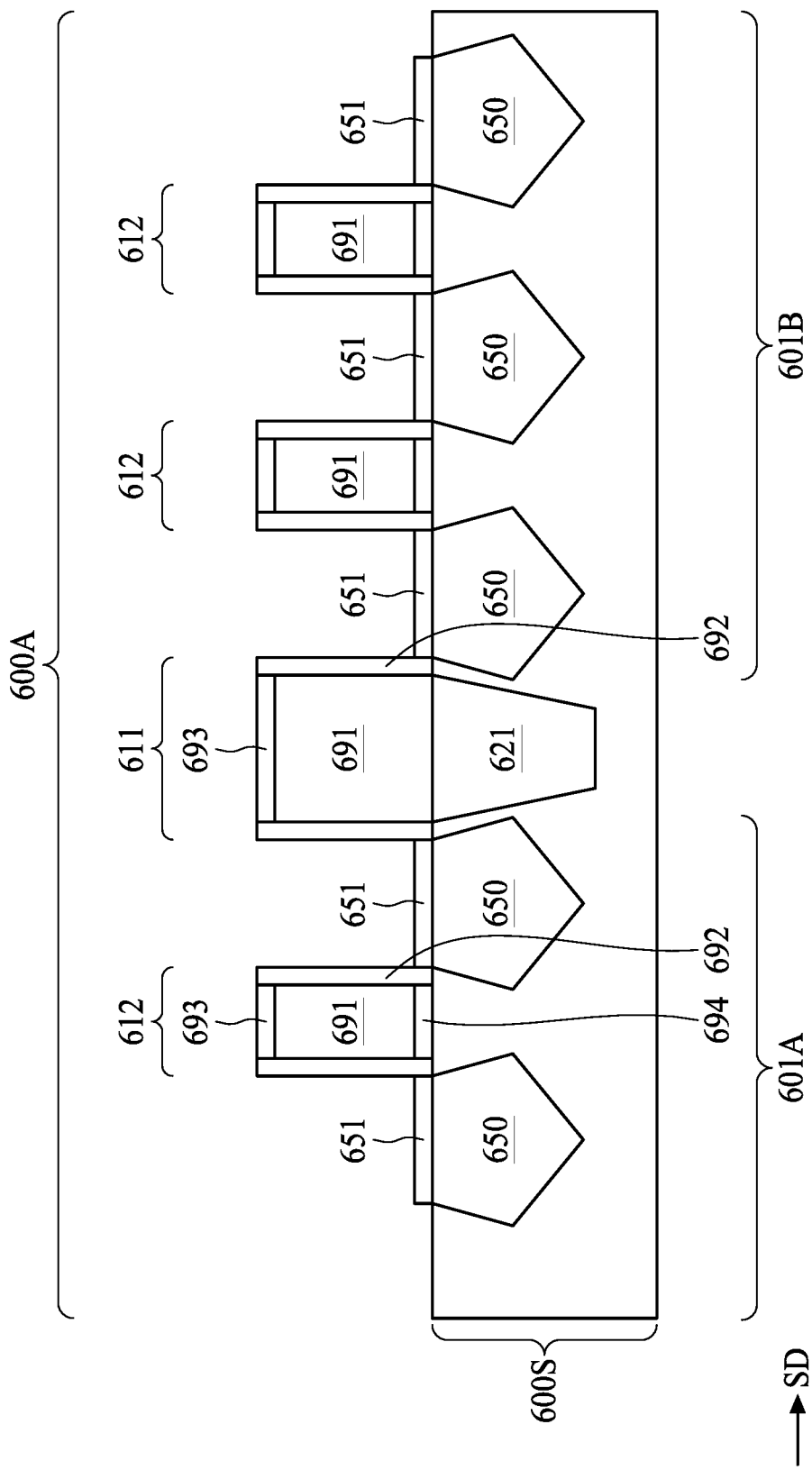
FIG. 6B is a cross sectional view of the semiconductor device along a line A-A' in FIG. 6A, in accordance with some embodiments of the present disclosure.

Referring to FIG. 6A, FIG. 6A is a schematic drawing illustrating a top view perspective of a semiconductor device, FIG. 6B is a cross sectional view of the semiconductor device along a line A-A' in FIG. 6A, in accordance with some embodiments of the present disclosure. FIG. 6A illustrates a top view of a first device region 600A, which is formed and defined in a substrate 600S (shown in FIG. 6B). In some embodiments, the first device region 600A includes a metal-oxide-semiconductor field-effect-transistor (MOSFET) device. In some of the embodiments, the first device region 600A is a PMOS region. In some other embodiments, the first device region 600A is an NMOS region. It should be understood that the first device region 600A may further include other devices, such as resistors, capacitors, inductors, diodes, or other micro-electric devices that can be implemented in integrated circuits.

The substrate 600S may be a semiconductor wafer, such as a silicon wafer. Alternatively, the substrate may include other elementary semiconductors such as germanium. In alternative embodiments, the substrate 600S may include a semiconductor-on-insulator (SOI) structure. In alternative embodiments, the substrate 600S may include a buried layer such as an n-type buried layer (NBL), a p-type buried layer (PBL), and/or a buried dielectric layer including a buried oxide (BOX) layer. In some embodiments, the substrate 600S may include doped features such as an n-well and p-well. In the present embodiment, the substrate 600S includes a p-type doped silicon substrate.

The first device region 600A further include a first active region 601A and a second active region 601B, wherein each of the first active region 601A and the second active region 601B are surrounded by an isolation region 621, and a portion 621a of the isolation region 621 is spacing between the first active region 601A and the second active region 601B. In some embodiments, the isolation region 621 includes oxide or other suitable insulation material, such as shallow trench isolation, deep trench isolation, local oxidation of silicon (LOCOS), or the like. In some embodiments, the first active region 601A and the second region 601B may include source/drain region. The first active region 601A and the second active region 601B may have identical conductivity type.

The first device region 600A further includes a plurality of dummy gate 611 and a plurality of gate 612 extending along a primary direction PD. The dummy gate 611 at least includes a gate portion 691 and a pair of spacer 692 at two opposing sidewalls of the gate portion 691 along the secondary direction SD. In some embodiments, a hard mask layer 693 is formed at a top surface of each of the dummy gate 611 and the gates 612. In some of the embodiments, a gate oxide layer 694 may be formed between the gate portion 691 of the gate 612 and the substrate 600S. In some embodiments, the gate portion 691 can be a stripe, such as a polysilicon stripe. In some embodiments, when the gate portion 691 of the dummy gate 611 is made of poly material (e.g. polysilicon), additional gate oxide layer may not be formed between the gate portion 691 and the substrate 600S. In some embodiments, when the gate portion 691 of the dummy gate 611 includes high-k metal gate, additional gate oxide layer may be formed between the gate portion 691 and the substrate 600S. In some embodiments, the gate 612 may be a functional gate or an active gate.

Each lateral side of the first active region 601A and the second region 601B on a secondary direction SD substantially perpendicular to the primary direction PD is under a coverage of one dummy gate 611. In some embodiments, one of the dummy gates 611 covers a side of the first active region 601A, a side of the second active region 601B facing the first active region 601A, and a portion 621a of the isolation region 621 spacing between the first active region 601A and the second active region 601B. (Herein, a boundary between the active region and the isolation region can also be referred to as oxide define (OD) edge). In some embodiments, a width W0 of the portion 621a of the isolation region 621 along the secondary direction is less than a width W1 (including the entire gate portion 691 and two times of a thickness of a spacer 692) of the dummy gate 611. In some embodiments, a thickness of the spacer along the secondary direction SD on one side is in a range from about 5 nm to about 10 nm. In some embodiments, the entire portion 621a is under a coverage of a vertical projection area of the dummy gate 611. In some embodiments, the width W1 of the dummy gate 611 is greater than a width W2 of the gate 612. A portion of the dummy gate 611 is directly over the first active region 601A, a portion of the dummy gate 611 is directly over the second active region 601B, and a portion of the dummy gate 611 is directly over the isolation region 621.

Epitaxial features 650 are formed between two adjacent gates 612 and between a dummy gate 611 and a gate 612. A silicide layer 651 may be formed over the epitaxial features 650. Each of facets of the epitaxial features 650 is spaced away from a sidewall of the isolation region 621 by a portion of the substrate 600S. Alternatively stated, a portion of the first active region 601A (or the second active region 601B) is in direct contact with epitaxial features 650, a bottom surface of the gate 612, and a bottom surface of the dummy gate 611. In some embodiments, the epitaxial features 650 may include silicon germanium (SiGe), or the like. In some of the alternative embodiments, a portion of the spacer 692 can be in direct contact with a top surface of the isolation region 621 where a width of the gate portion 691 of the dummy gate 611 is less than the width W0 of the portion 621a of the isolation region 621. In some alternative embodiments, a width of the gate portion 691 of the dummy gate 611 may be greater than the width W0 of the portion 621a of the isolation region 621.

In some of the embodiments, a distance J1 between a central line of the dummy gate 611 and a central line of the gate 612 is substantially identical to a distance J2 between two central lines of each of two adjacent gates 612. A dimension D1 of the dummy gate 611 and a dimension D2 of the gate 612 along the primary direction PD are greater than a dimension D0 of the active regions 601A and 601B.

Figure 7A:
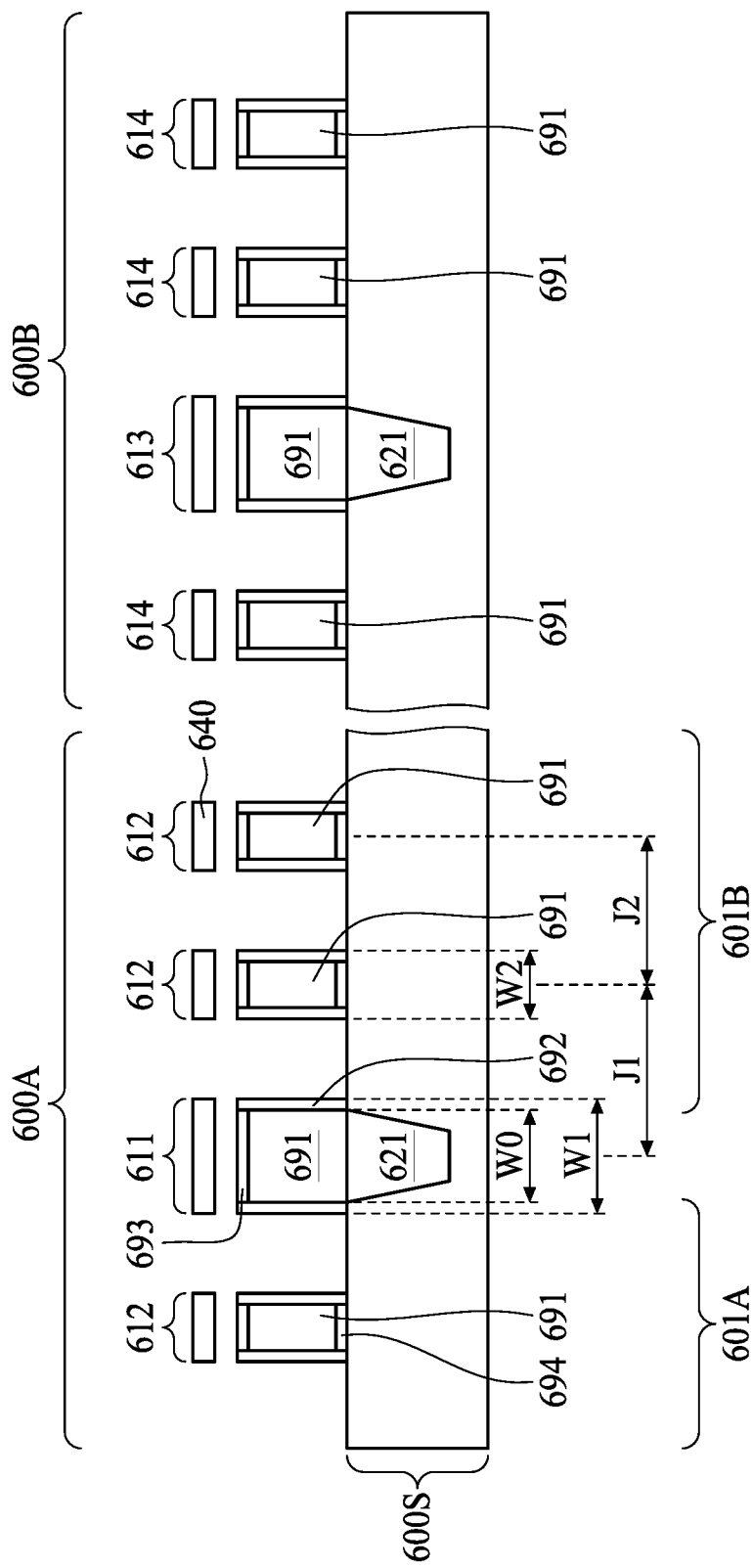
FIG. 7A to FIG. 7G are cross sectional views of a semiconductor device during intermediate stages of manufacturing operations, according to some embodiments of the present disclosure.

Referring to FIG. 7A, FIG. 7A is a cross sectional view of a semiconductor device during intermediate stages of manufacturing operations, according to some embodiments of the present disclosure. A substrate 600S including a first device region 600A and a second device region 600B is provided. In some embodiments, the first device region 600A and the second device region 600B are configured to be formed with different types of devices. For example, the first device region 600A is a PMOS region and the second device region 600B is an NMOS region, or vice versa. A material of the substrate 600S may be referred to the discussion in FIG. 6A to FIG. 6B. An isolation region 621 is formed in the substrate 600S, which defines the first active region 601A and the second active region 601B in the first device region 600A.

A plurality of dummy gates 211 and gates 212 are formed over the first device region 600A. In some embodiments, the dummy gates 211 and the gates 212 are formed by a single patterning operation by utilizing a photomask 640 in a photolithography operation. In some of the embodiments, a distance J1 between a central line of the dummy gate 611 and a central line of the gate 612 is substantially identical to a distance J2 between two central lines of each of two adjacent gates 612. The implantation of the dummy gates 611 may be for alleviating diffraction issue and improve lithography pattern density uniformity. Although the separation between a dummy gate 611 and a gate 612 may be narrower than a separation between two adjacent gates 612, however it is found herein that the benefit of enlarging a size of the dummy gate 611 that is directly above the isolation region 621 may be a more prominent factor for device performance than slightly trading-off the lithography pattern density uniformity related to changing a size of such dummy gate 611. In some embodiments, the second device region 600B may include similar configuration of gate structures and isolation regions.

As previously discussed in FIG. 6A to FIG. 6B, the dummy gate 611 at least includes a dummy gate portion 691 and a pair of spacer 692 at two opposing sidewalls of the dummy gate portion 691, and may further include a hard mask layer 693 at a top surface of each of the dummy gate 611. In some embodiments, the portion of the isolation region between the first active region 601A and the second active region 602B is entirely under a coverage of a vertical projection area of the dummy gate 611. The gate 612 may be apart from and substantial parallel to the dummy gate 611, and each of the gate 612 may include a pair of spacer 692 at two opposing sidewalls, a hard mask layer 693 at a top surface, and a gate oxide layer 694 at a bottom surface. In some embodiments, dummy gates 613 similar to the dummy gates 611 and gates 614 similar to the gates 612 may be formed in the second device region 600B, but the present disclosure is not limited thereto. In some of the embodiments, the dummy gates 611 and 613, the gates 612 and 614 may be formed by a single patterning operation by utilizing a photomask 640 in a photolithography operation.

Figure 7B:
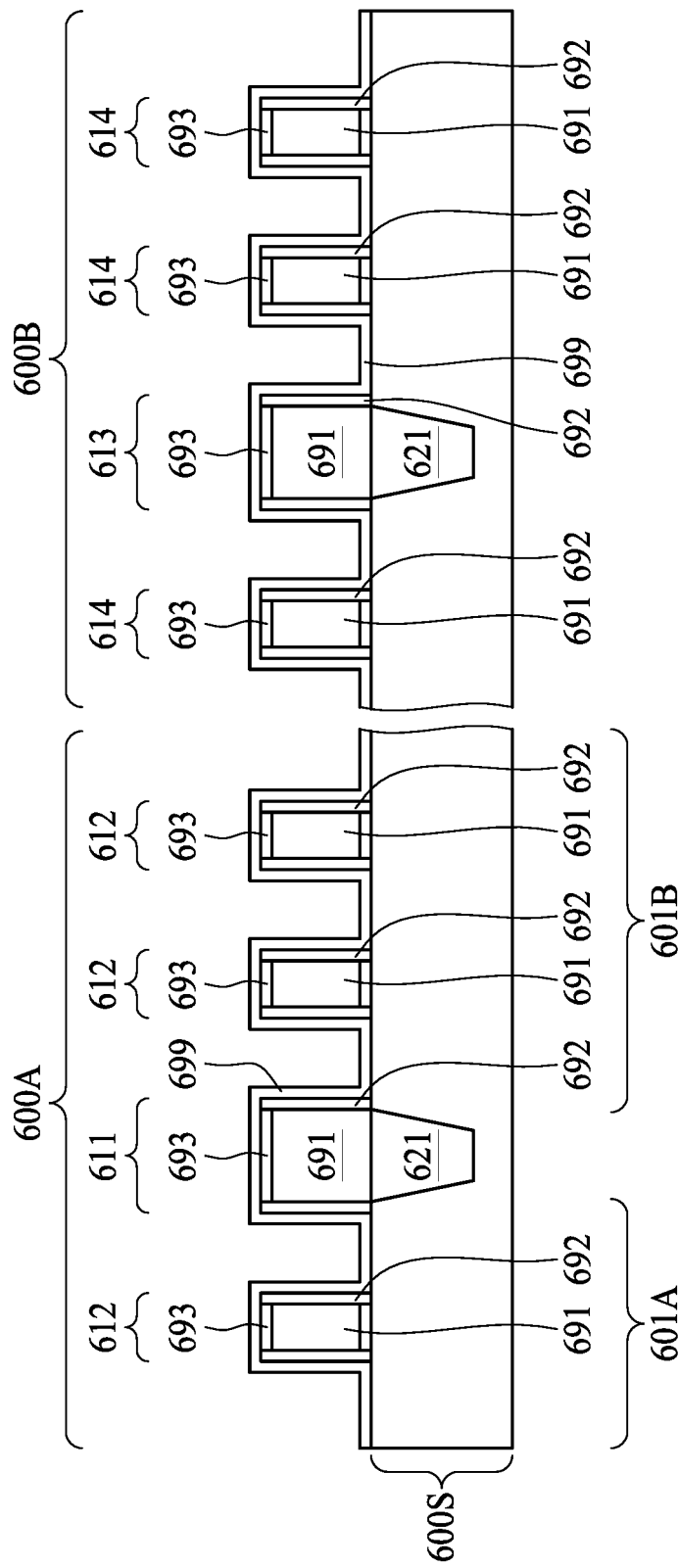
Figure 7C:
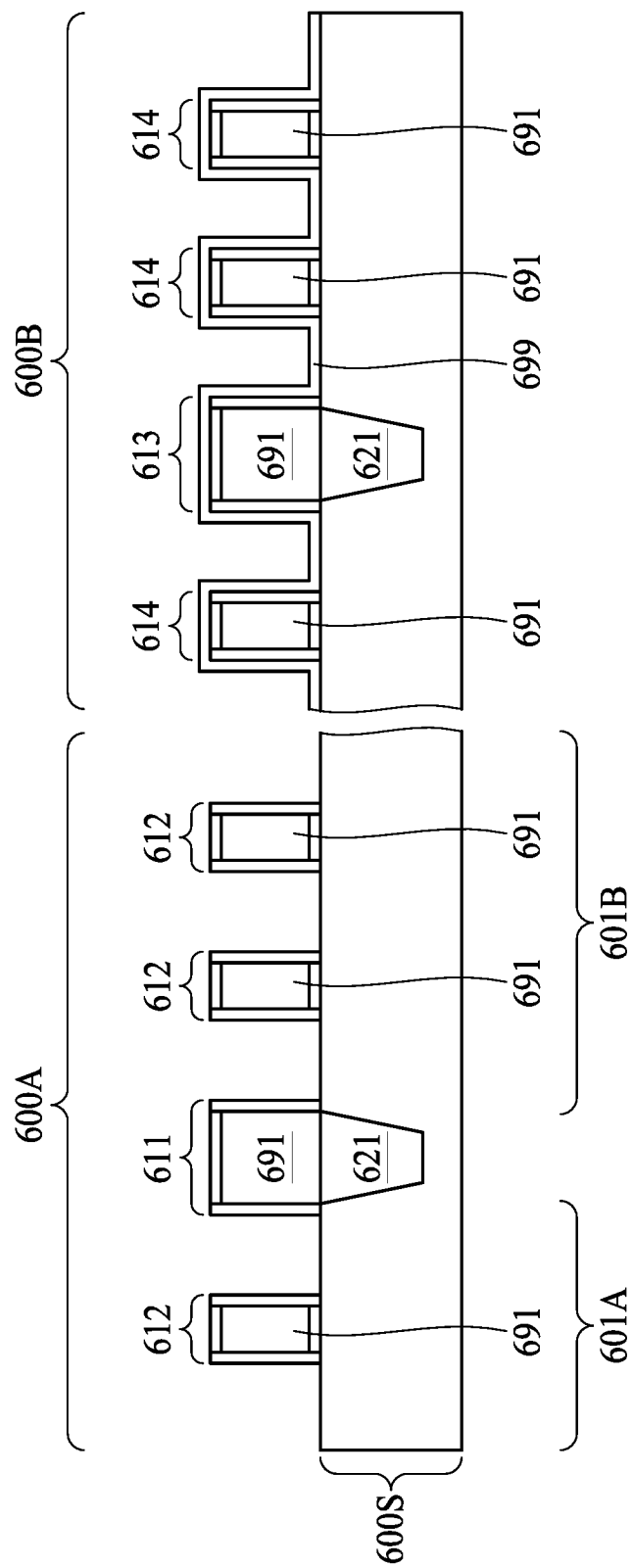

Referring to FIG. 7B, FIG. 7B is a cross sectional view of a semiconductor device during intermediate stages of manufacturing operations, according to some embodiments of the present disclosure. A mask layer 699 is formed over the substrate 600S to cover the dummy gate 611 and the gate 612 in the first device region 600A as well as the dummy gate 613 and the gate 614 in second device region 600B. Referring to FIG. 7C, FIG. 7C is a cross sectional view of a semiconductor device during intermediate stages of manufacturing operations, according to some embodiments of the present disclosure. The mask layer 699 over the first device region 600A is selectively removed, while the mask layer 699 over the second device region 600B is remained. In some embodiments, the removal operation includes etching.

Figure 7D:
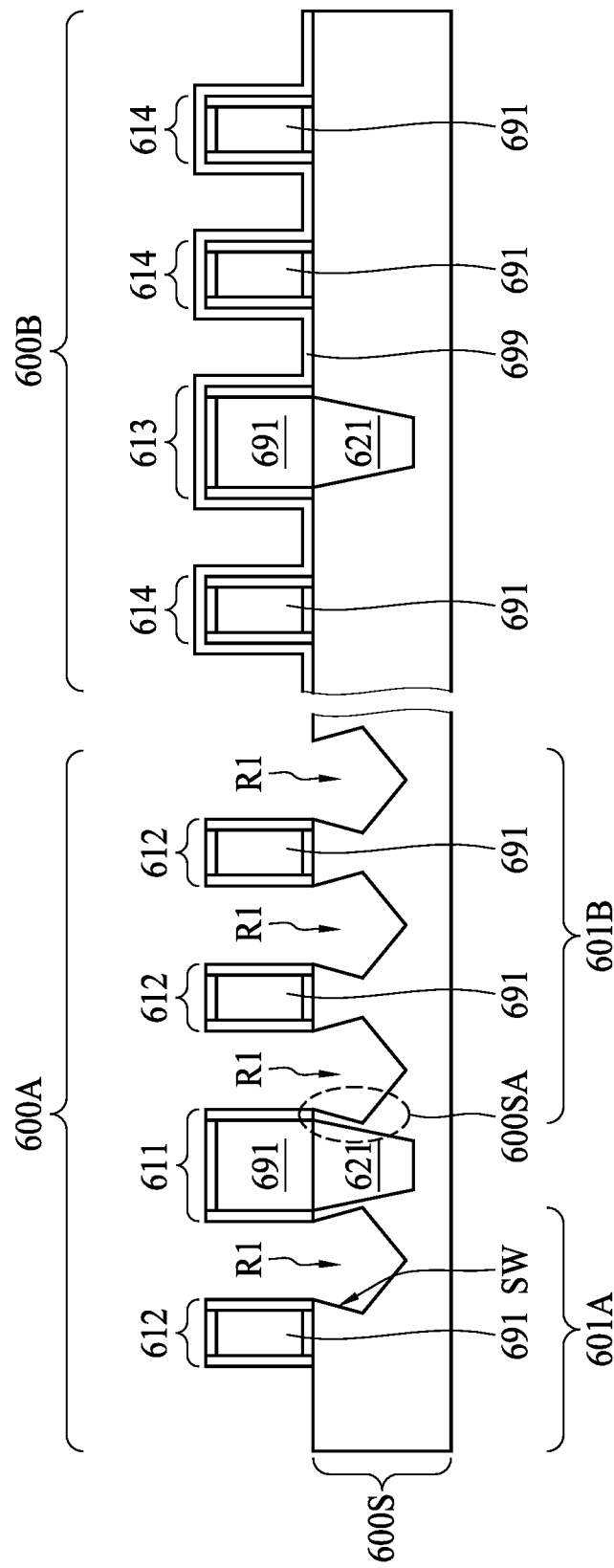
Figure 7E:
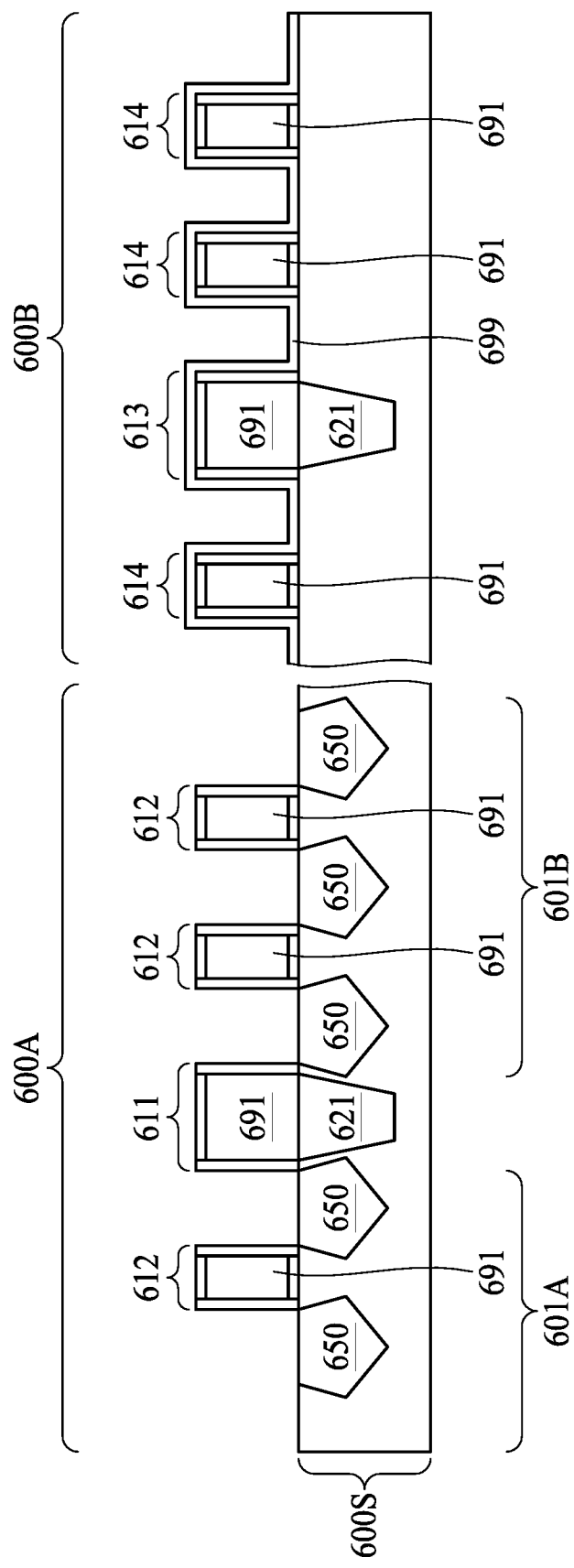

Referring to FIG. 7D, FIG. 7D is a cross sectional view of a semiconductor device during intermediate stages of manufacturing operations, according to some embodiments of the present disclosure. In FIG. 7D, a plurality of recesses R1 are formed in the first device region 600A, wherein the recesses R1 are between the between a dummy gate 611 and a gate 612 and between two adjacent gates 612. Referring to FIG. 7E, FIG. 7E is a cross sectional view of a semiconductor device during intermediate stages of manufacturing operations, according to some embodiments of the present disclosure. In FIG. 7E, a plurality of epitaxial features 650 are formed in each of the recesses R1 in the first device region 600A. As previously discussed in FIG. 1A to FIG. 3, in epitaxial growth operation, when a sidewall of the isolation region is exposed by a recess proximal to a dummy gate, the epitaxial feature may not effectively grow along a surface of isolation region material (such as oxide layer that can be utilized as shallow trench isolation or LOCOS), thus causing an undersized epitaxial feature and/or a non-uniform top surface of the epitaxial feature. Referring back to FIG. 7A and FIG. 7D, therefore by virtue of having a dummy gate 611 being wider and covering the portion of the isolation region 621 underneath (i.e. the portion 621a as shown in FIG. 6A), the sidewalls of the isolation region 621 are free from being exposed by the recesses R1. Therefore, during the operation of epitaxial growth, the epitaxial features 650 are free from being in direct contact with the isolation region 621. Alternatively stated, a portion 600SA of a material of the substrate 600S (such as silicon layer) is spacing between the isolation region 621 and a sidewall SW (shown in FIG. 6D) of the recess R1 subsequent to the formation of the recesses R1. Such portion 600SA of the substrate 600S is under a coverage of vertical projection area of the dummy gates 611. In some embodiments, each of the recess R1 includes inclined surfaces, and a portion of the recess R1 is under a coverage of a vertical projection area of the dummy gates 611 or the gates 612.

Figure 7F:
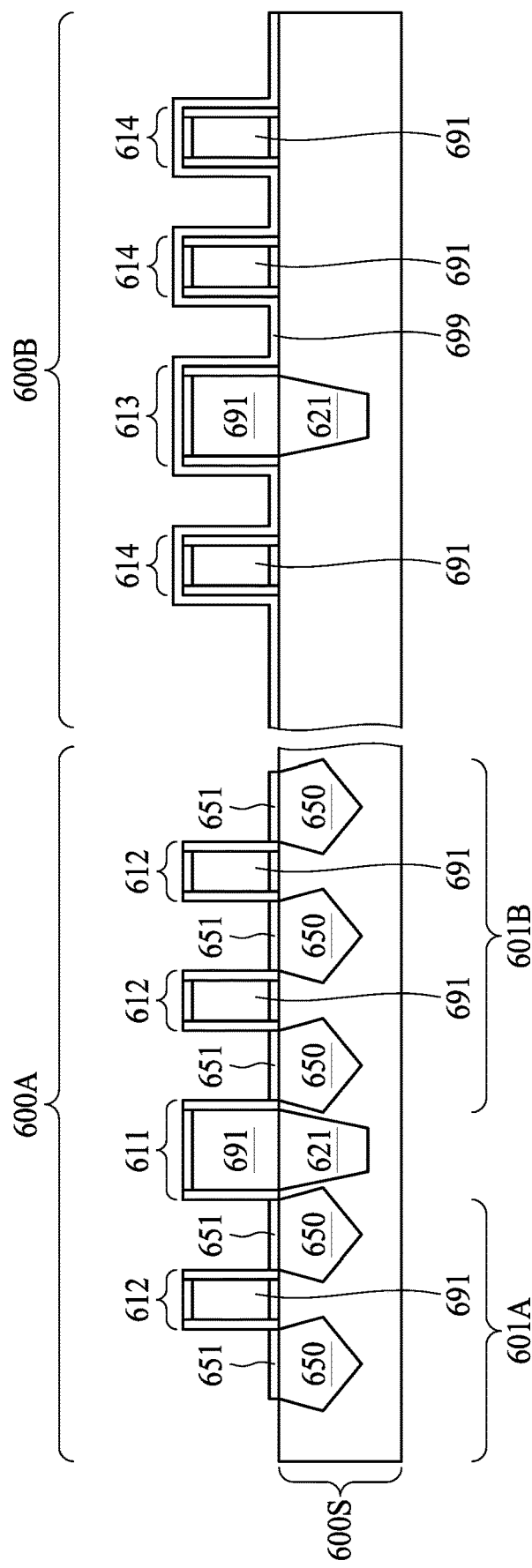

Referring to FIG. 7F, FIG. 7F is a cross sectional view of a semiconductor device during intermediate stages of manufacturing operations, according to some embodiments of the present disclosure. A silicide layer 651 is formed over the epitaxial features 650. An implanting operation of a dopant having a first conductivity type can be performed over the epitaxial features 650 and the silicide layer 651 in the first device region 600A, while the second device region 600B is covered by the mask layer 699, to achieve certain electrical properties in the first device region 600A. Since the volume of the epitaxial features 650 more desired (i.e. adequate) and a profile of a top surface of the epitaxial features 650 may be more uniformed, a surface of substrate 600S being exposed during the implanting operation us deceased, thus the leakage issue may be improved. Comparing to the comparative embodiments discussed in FIG. 1A to FIG. 3, the devices in the first device region 600A has improved symmetric cross-section profile and a more uniformed electrical properties. Furthermore, conductive contacts (not shown) can be formed over the epitaxial features 650, and by implementing the aforementioned configurations and techniques, the issue of failure to connect a bottom surface of the conductive contact and a top surface of the epitaxial features 650 may be alleviated.

Figure 7G:
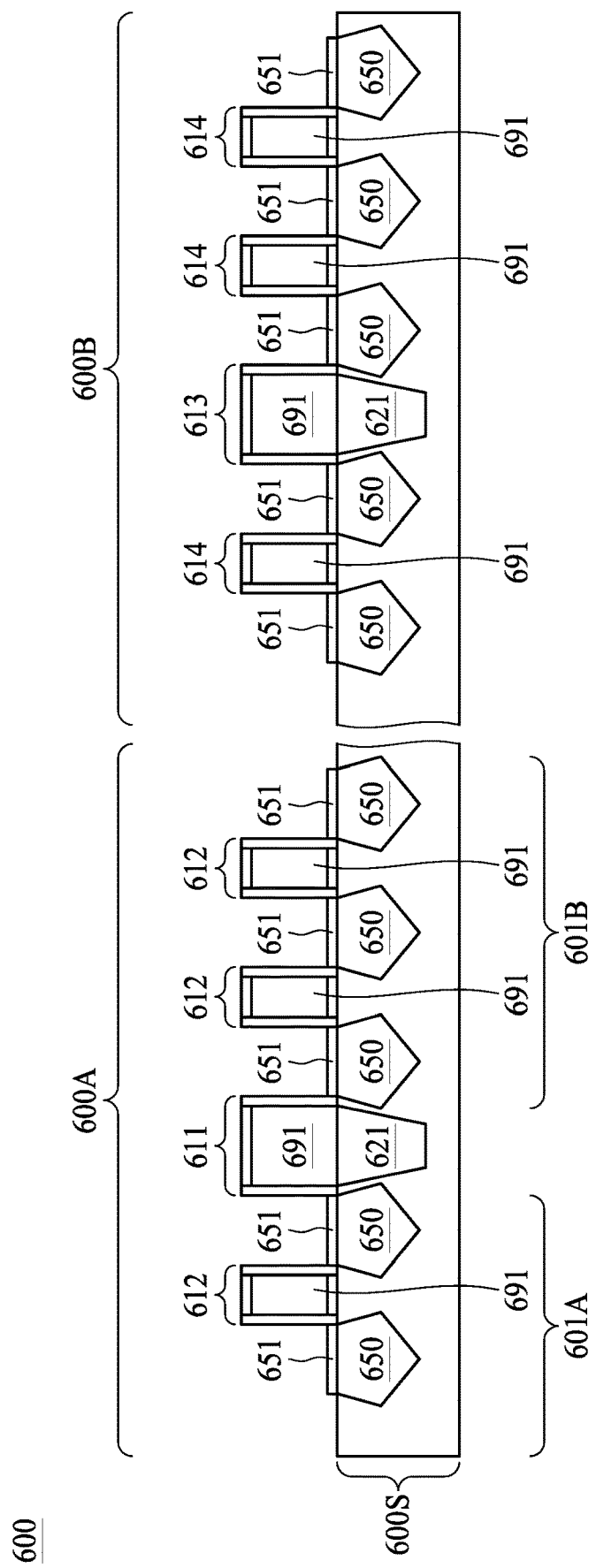

Referring to FIG. 7G, FIG. 7G is a cross sectional view of a semiconductor device during intermediate stages of manufacturing operations, according to some embodiments of the present disclosure. The mask layer 699 in the second device region 600B is removed. The second device region 600B can be implanted with dopant having a second conductivity type different from the first conductivity type. Thus, the first device region 600A and the second device region 600B can be defined as different types of device regions. For example, the first device region 600A is formed as PMOS region and the second device region is formed as NMOS region, or vice versa. Thereby, a device 600 including the first device region 600A and the second device region 600B is formed.

Optionally, similar techniques discussed in FIG. 7D to FIG. 7F can be implemented in the second device region 600B, wherein the dummy gate 613 is wider than the underlying isolation region 621, and the sidewalls of the isolation region 621 is free from being exposed by a recess before forming epitaxial features in the recess.

Figure 8:
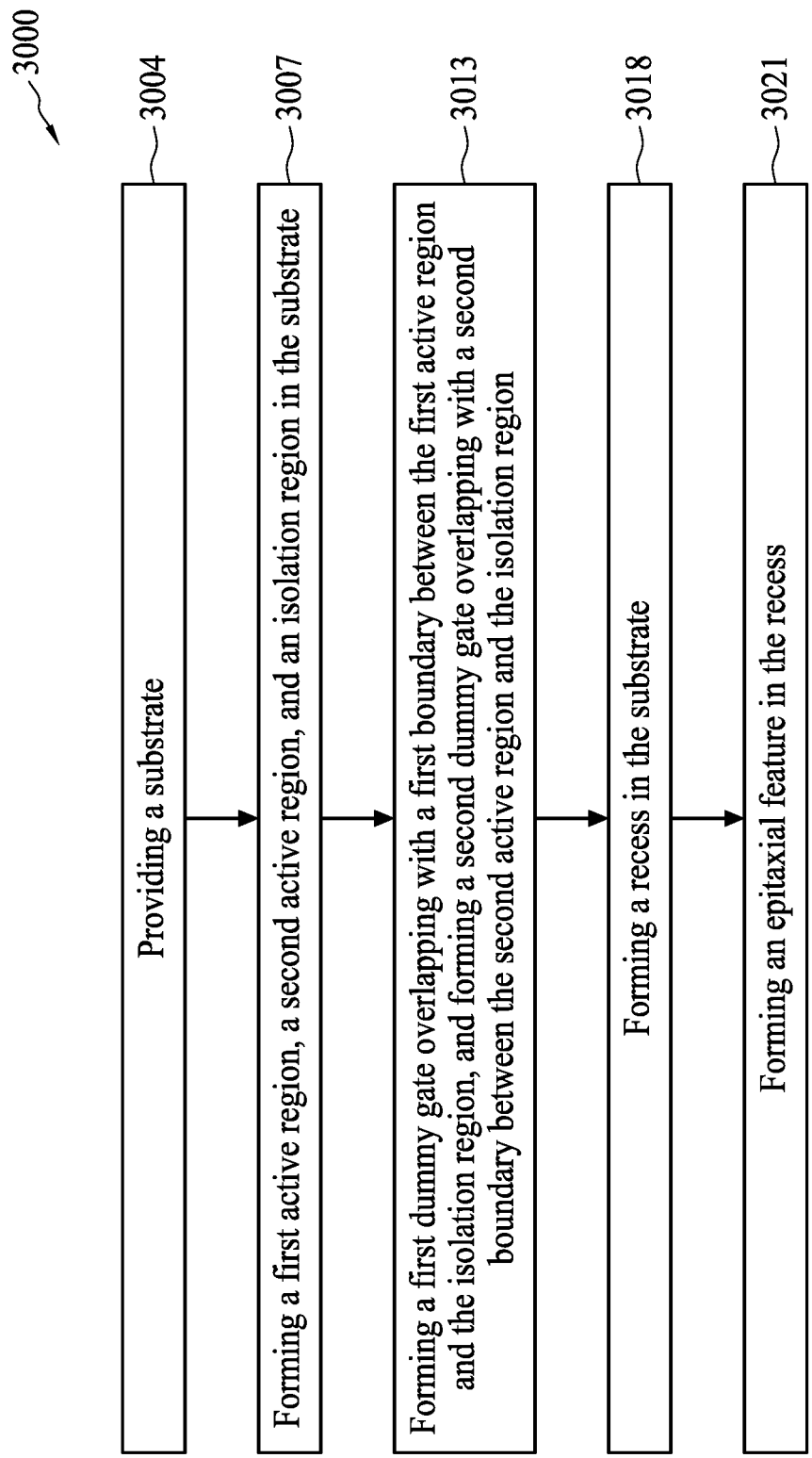
FIG. 8 shows a flow chart representing a method for fabricating a semiconductor device, in accordance with some embodiments of the present disclosure.

Referring to FIG. 8, FIG. 8 shows a flow chart representing a method for fabricating a semiconductor device, in accordance with some embodiments of the present disclosure. The method 3000 for fabricating a semiconductor device includes providing a substrate (operation 3004, which can be referred to FIG. 10A), forming a first active region, a second active region, and an isolation region in the substrate (operation 3007, which can be referred to FIG. 10A), forming a first dummy gate overlapping with a first boundary between the first active region and the isolation region, and forming a second dummy gate overlapping with a second boundary between the second active region and the isolation region (operation 3013, which can be referred to FIG. 10A), forming a recess in the substrate (operation 3018, which can be referred to FIG. 10D), and forming an epitaxial feature in the recess (operation 3021, which can be referred to FIG. 10E).

Figure 9A:
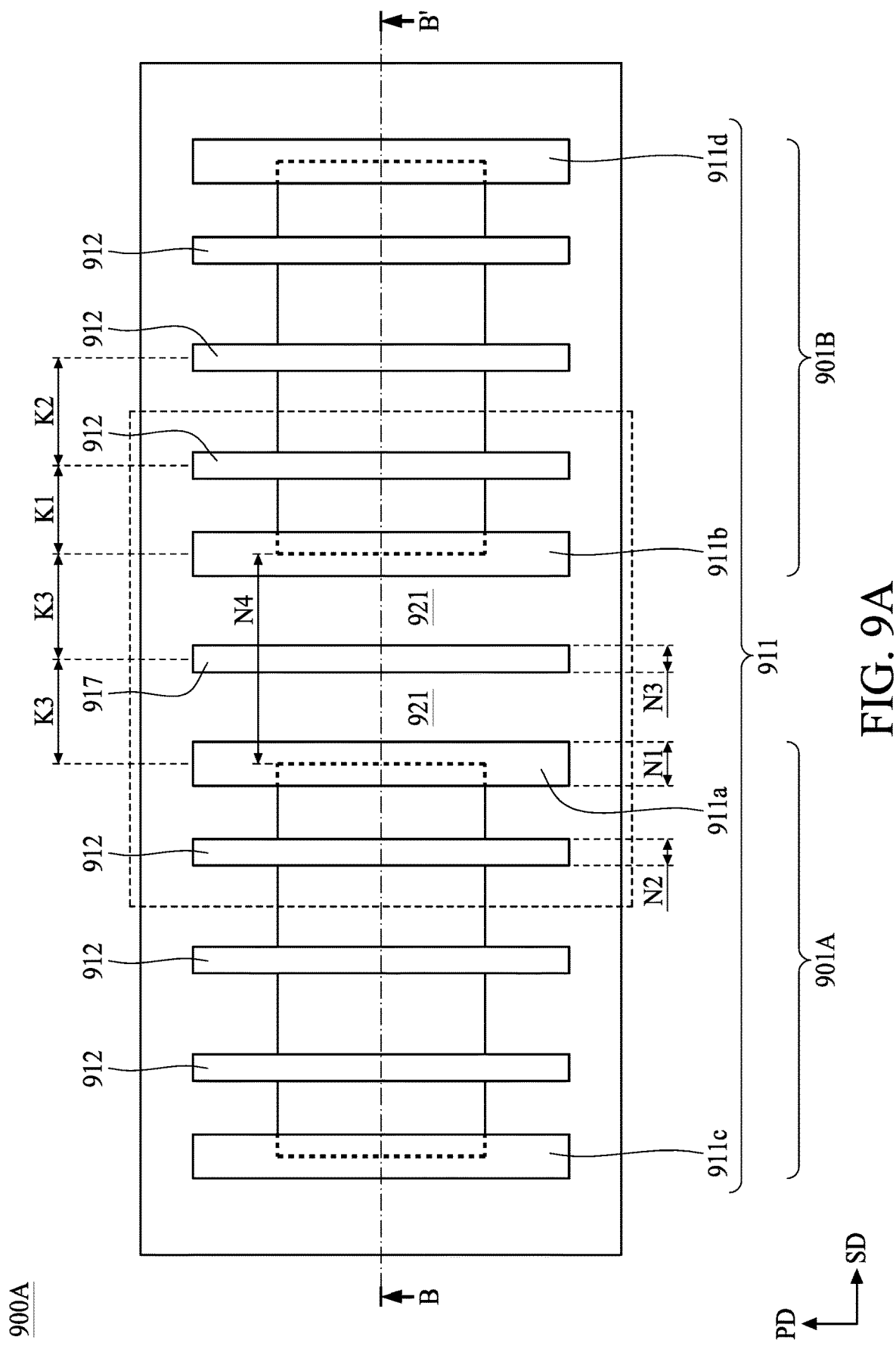
FIG. 9A is a schematic drawing illustrating a top view perspective of a semiconductor device, in accordance with some embodiments of the present disclosure.
Figure 9B:
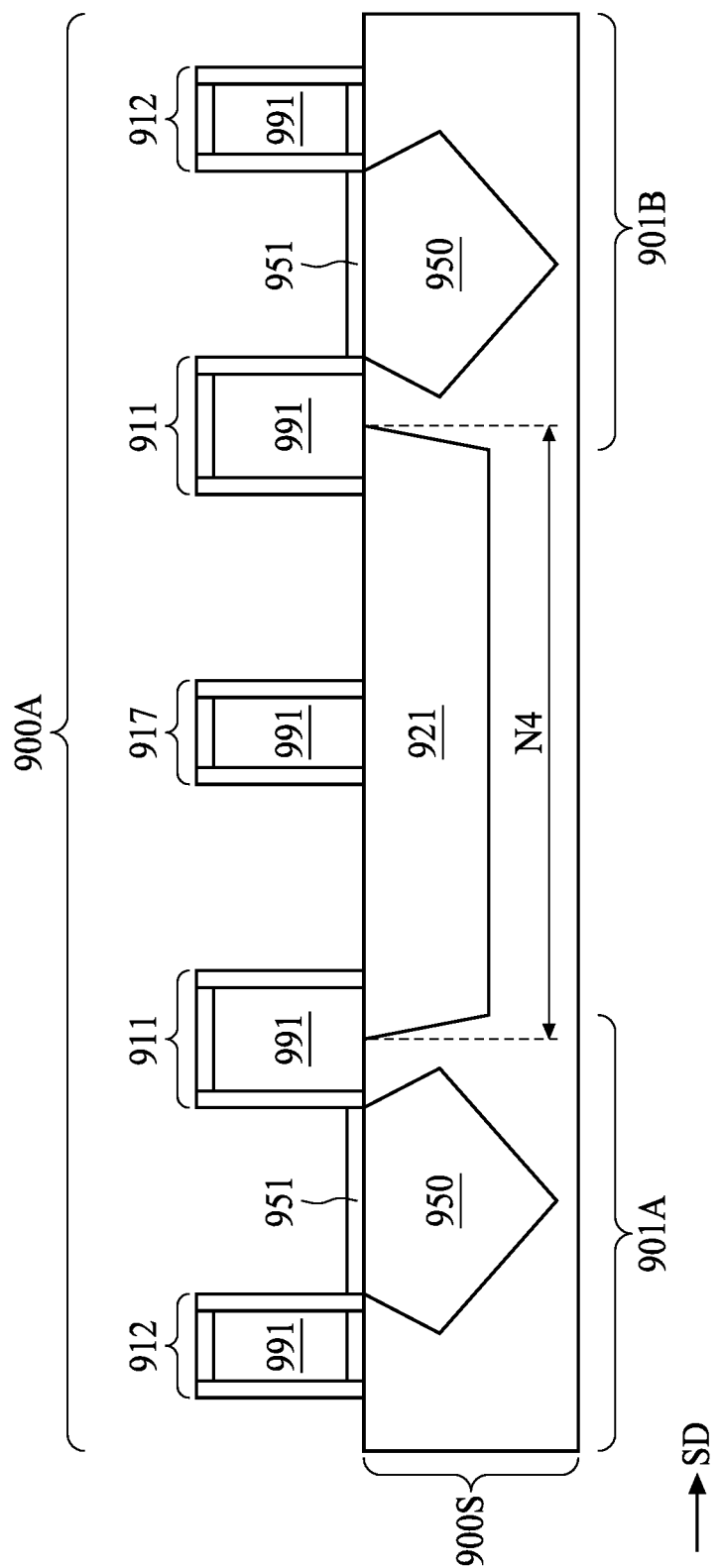
FIG. 9B is a cross sectional view of the semiconductor device along a line B-B' in FIG. 9A, in accordance with some embodiments of the present disclosure.

Referring to FIG. 9A and FIG. 9B, FIG. 9A is a schematic drawing illustrating a top view perspective of a semiconductor device, FIG. 9B is a cross sectional view of the semiconductor device along a line B-B' in FIG. 9A, in accordance with some embodiments of the present disclosure. FIG. 9A illustrates a top view of a first device region 900A, which is formed and defined in a substrate 900S (shown in FIG. 9B). In some embodiments, the first device region 900A includes a metal-oxide-semiconductor field-effect-transistor (MOSFET) device. In some of the embodiments, the first device region 900A is a PMOS region. In some other embodiments, the first device region 900A is an NMOS region. It should be understood that the first device region 900A may further include other devices, such as resistors, capacitors, inductors, diodes, or other micro-electric devices that can be implemented in integrated circuits. A material of the substrate 900S may be similar to the substrate 600S as discussed in FIG. 6A to FIG. 6B.

The first device region 900A further include a first active region 901A and a second active region 901B, wherein each of the first active region 901A and the second active region 901B are surrounded by an isolation region 921, and a portion of the isolation region 921 is spacing between the first active region 901A and the second active region 901B. In some embodiments, the isolation region 921 includes oxide or other suitable insulation material, such as shallow trench isolation, deep trench isolation, local oxidation of silicon (LOCOS), or the like. In some embodiments, the first active region 901A and the second region 901B may include source/drain region. The first active region 901A and the second active region 901B may have identical conductivity type.

The first device region 900A further includes a plurality of dummy gate 911 (denoted as 911a, 911b, 911c, 911d et cetera in FIG. 9A) and a plurality of gate 912 extending along a primary direction PD. The dummy gate 911 at least includes a gate portion 991 and a pair of spacer 992 at two opposing sidewalls of the gate portion 991 along the secondary direction SD. In some embodiments, the gate portion 991 can be a stripe, such as a polysilicon stripe. In some embodiments, a hard mask layer 993 is formed at a top surface of each of the dummy gate 911 and the gates 912. In some of the embodiments, a gate oxide layer 994 may be formed between the gate portion 991 of the gate 912 and the substrate 900S. In some embodiments, when the gate portion 991 of the dummy gate 911 is made of poly material (e.g. polysilicon), additional gate oxide layer may not be formed between the gate portion 991 and the substrate 900S. In some embodiments, when the gate portion 991 of the dummy gate 911 includes high-k metal gate, additional gate oxide layer may be formed between the gate portion 991 and the substrate 900S. In some embodiments, the gate 912 may be a functional gate or an active gate.

A boundary between the first active region 901A and the isolation region 921 is under a coverage of a vertical projection area of one dummy gate 911a, a boundary between the second active region 901B and the isolation region 921 is under a coverage of a vertical projection area of another dummy gate 911b. Another dummy gate 911c is disposed over a boundary between the first active region 901A and the isolation region 921 and opposite to the dummy gate 911a along the secondary direction SD, another dummy gate 911d is disposed over a boundary between the second active region 901B and the isolation region 921 and opposite to the dummy gate 911b along the secondary direction SD. One or more gates 912 extending along the primary direction PD above the first active region 901A are spacing between the dummy gates 911a and 911c, and one or more gates 912 extending along the primary direction PD above the second active region 901B are spacing between the dummy gates 911b and 911d. In some embodiments, a distance K1 between a central line of the dummy gate 911 and a central line of the gate 912 is substantially identical to a distance K2 between two central lines of each of two adjacent gates 912. A dimension N1 of the dummy gate 911 is greater than a dimension N2 of the gate 912 along the primary direction PD.

One or more auxiliary dummy gates 917 extending along the primary direction PD may be formed over the isolation region 921. The auxiliary dummy gate 917 is between the dummy gate 911a and the dummy gate 911b, or alternatively stated, between the first active region 901A and the second active region 901B from a top view perspective. In the embodiments of having one auxiliary dummy gate 917 between the dummy gate 911a and the dummy gate 911b, a distance (denoted as K3) between a central line of the auxiliary dummy gates 917 and a central line of the dummy gate 911a is substantially identical to a distance (denoted as K3) between a central line of the auxiliary dummy gates 917 and a central line of the dummy gate 911b. Optionally, the distance K3 is substantially identical to the aforementioned distance K1 or distance K2, but the present disclosure is not limited thereto. Alternatively, in the embodiments of having a plurality of auxiliary dummy gates 917 between the dummy gate 911a and the dummy gate 911b, a distance between each of a central line of the auxiliary dummy gates 917 is substantially identical, and may optionally be identical to the aforementioned distance K1, distance K2, a distance between a central line of the dummy gate 911a and a central line of an auxiliary dummy gate 917 adjacent to the dummy gate 911a and/or a distance between a central line of the dummy gate 911b and a central line of an auxiliary dummy gate 917 adjacent to the dummy gate 911b. Alternatively stated, each of the central line of each gate structures (including the dummy gates 911a, 911b, 911c, 911d, gates 912, auxiliary dummy gate(s) 917) are disposed in an equally spaced manner.

In some embodiments, a dimension N4 along the secondary direction SD of the isolation region 921 between the first active region 901A and the second active region 901B is greater than a dimension N3 of the auxiliary dummy gates 917. At least a portion of a top surface of the isolation region 921 is exposed from the auxiliary dummy gate(s) 917 and the dummy gates 911.

Epitaxial features 950 are formed between two adjacent gates 912 and between a dummy gate 911 and a gate 912. A silicide layer 951 may be formed over the epitaxial features 950. Each of facets of the epitaxial features 950 is spaced away from a sidewall of the isolation region 921 by a portion of the substrate 900S. Alternatively stated, a portion of the first active region 901A (or the second active region 901B) is in direct contact with epitaxial features 950, a bottom surface of the gate 912, and a bottom surface of the dummy gate 911. In some embodiments, the epitaxial features 950 may include silicon germanium (SiGe), or the like. In some of the embodiments, a portion of the spacer 992 is in direct contact with a top surface of the isolation region 921.

Figure 10A:
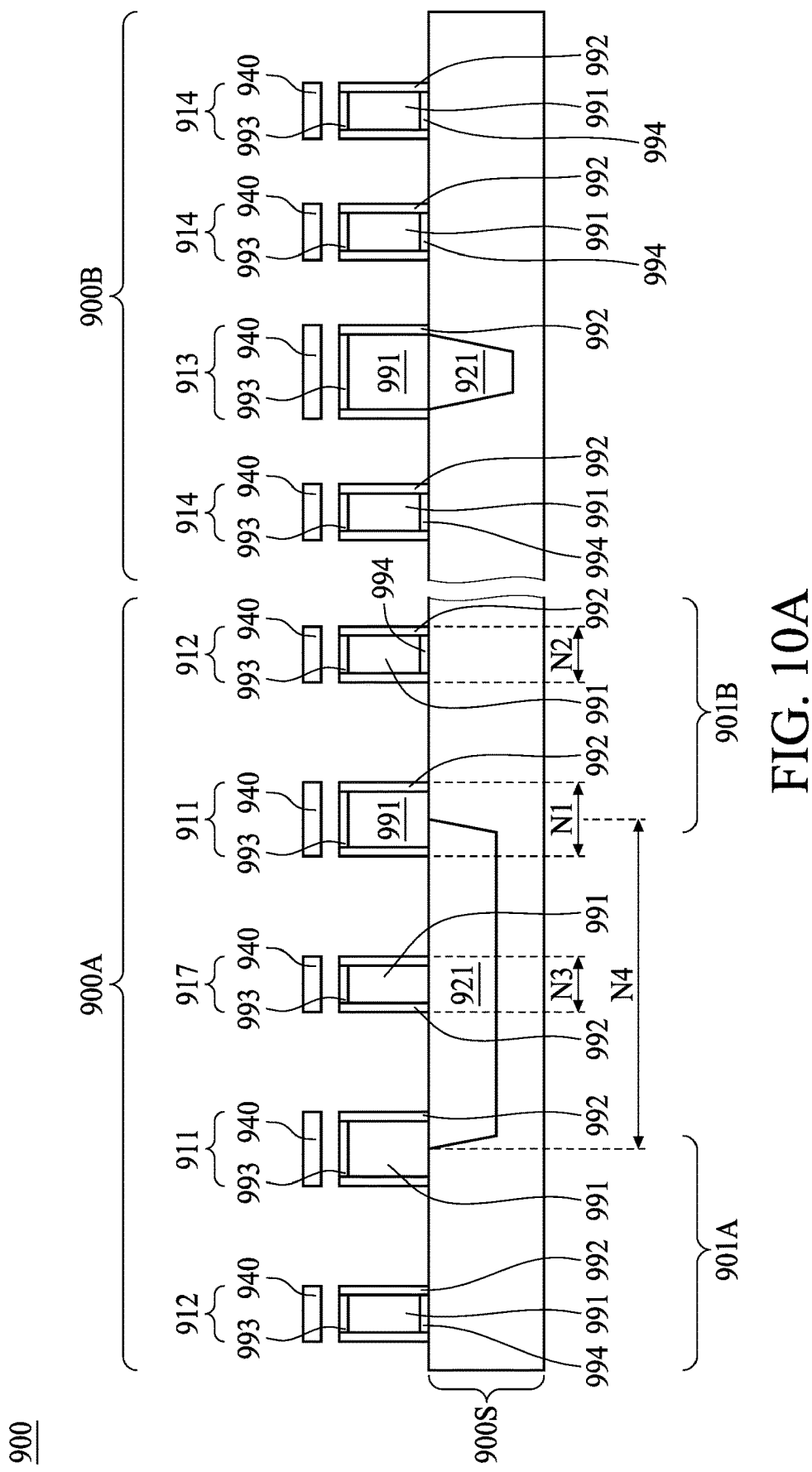
FIG. 10A to FIG. 10G are cross sectional views of a semiconductor device during intermediate stages of manufacturing operations, according to some embodiments of the present disclosure.

Referring to FIG. 10A, FIG. 10A is a cross sectional view of a semiconductor device during intermediate stages of manufacturing operations, according to some embodiments of the present disclosure. A substrate 900S including a first device region 900A and a second device region 900B is provided. In some embodiments, the first device region 900A and the second device region 900B are configured to be formed with different types of devices. For example, the first device region 900A is a PMOS region and the second device region is an NMOS region, or vice versa. In some embodiments, a structural configuration of the second device region 900B may be similar to the first device region 900A. In some alternative embodiments, a structural configuration of the second device region 900B may be similar to the first device region 600A or the second device region 600B as discussed in FIG. 6A to FIG. 7G. A material of the substrate 900S may be similar to the substrate 600S discussed in FIG. 6A to FIG. 6B. An isolation region 921 is formed in the substrate 900S, which defines the first active region 901A and the second active region 901B in the first device region 901A.

A plurality of dummy gates 911, gates 912, and one or more auxiliary dummy gates 917 are formed over the first device region 900A, wherein the configuration is discussed in FIG. 9A to FIG. 9B. In some embodiments, the dummy gates 911, the gates 912, and the auxiliary dummy gates 917 are formed by a single patterning operation by utilizing a photomask 940 in a photolithography operation. The implantation of the dummy gates 911 and the auxiliary dummy gate(s) 917 may be for alleviating diffraction issue and improve lithography pattern density uniformity. Each of the center line of each gate structures (including the dummy gates 911a, 911b, 911c, 911d, gates 912, auxiliary dummy gate(s) 917 as shown in FIG. 9A to FIG. 9B) are disposed in an equally spaced manner. With such configuration, although the separation between a dummy gate 911 and a gate 912 may be narrower than a separation between two adjacent gates 912, however, similar to the discussion in FIG. 7A, the benefit of enlarging a size of the dummy gate 911 that is directly above a boundary of the isolation region 621 may be a more prominent factor for device performance than slightly trading-off the lithography pattern density uniformity related to changing a size of such dummy gate 911.

In some embodiments, dummy gates 913 similar to the dummy gates 911 and gates 914 similar to the gates 912 may be formed in the second device region 900B, but the present disclosure is not limited thereto. In some of the embodiments, the dummy gates 911 and 913, the gates 912 and 914 may be formed by a single patterning operation by utilizing a photomask 940 in a photolithography operation.

Figure 10B:
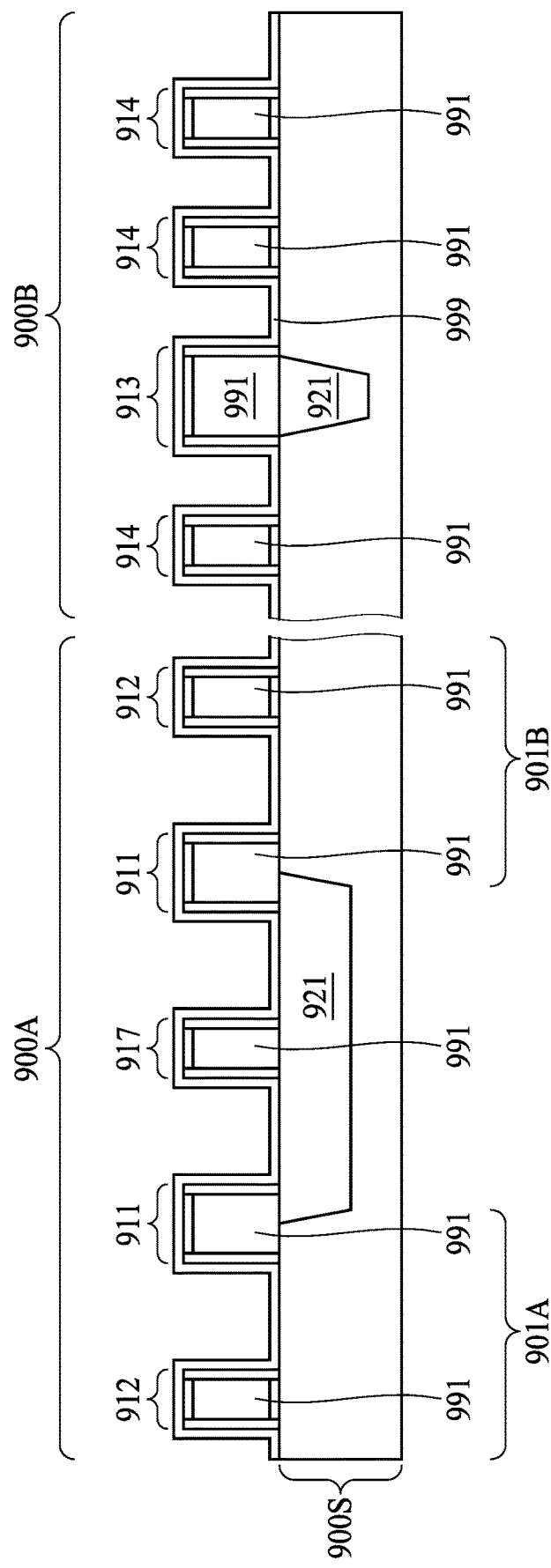
Figure 10C:
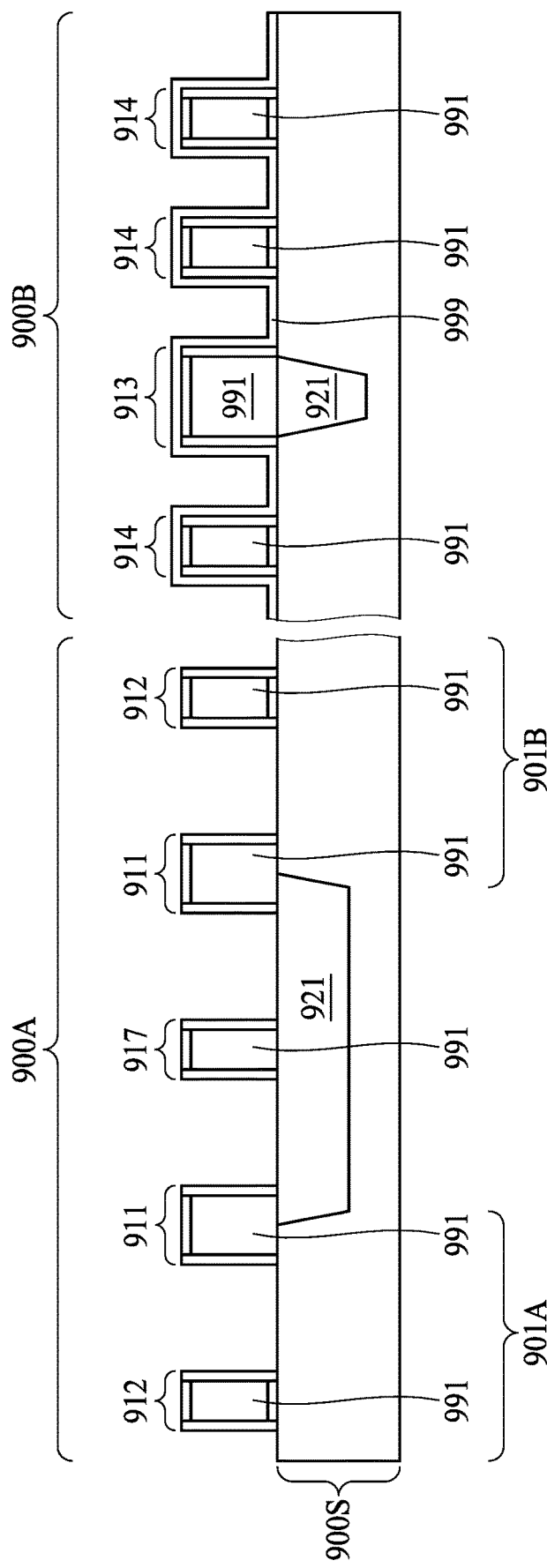

Referring to FIG. 10B, FIG. 10B is a cross sectional view of a semiconductor device during intermediate stages of manufacturing operations, according to some embodiments of the present disclosure. A mask layer 999 is formed over the substrate 900S to cover the dummy gates 911, the gates 912, the auxiliary dummy gate(s) 917 in the first device region 900A and the gate structures (such as the dummy gates 913 and the gates 914) in the second device region 900B. Referring to FIG. 10C, FIG. 10C is a cross sectional view of a semiconductor device during intermediate stages of manufacturing operations, according to some embodiments of the present disclosure. The mask layer 999 over the first device region 900A is selectively removed, while the mask layer 999 over the second device region 900B is remained. In some embodiments, the removal operation includes etching.

Figure 10D:
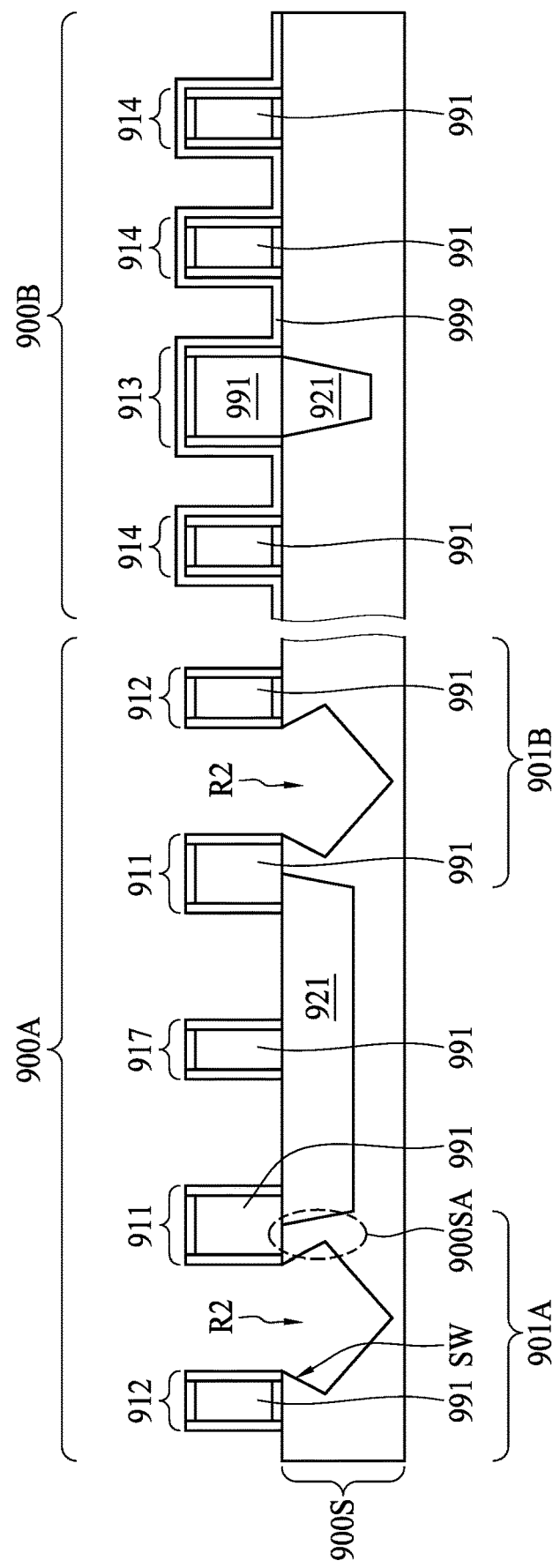
Figure 10E:
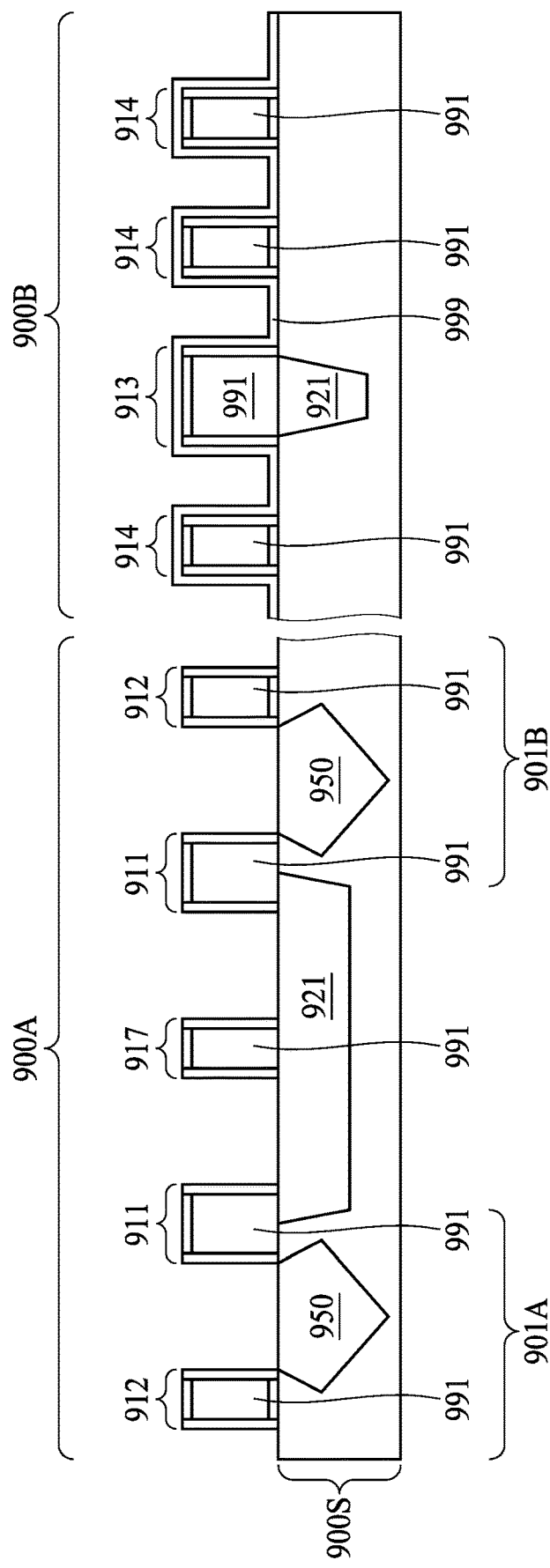

Referring to FIG. 10D, FIG. 10D is a cross sectional view of a semiconductor device during intermediate stages of manufacturing operations, according to some embodiments of the present disclosure. In FIG. 10D, a plurality of recesses R2 are formed in the first device region 900A, wherein the recesses R2 are between the between a dummy gate 911 and a gate 912 and between two adjacent gates 912. Referring to FIG. 10E, FIG. 10E is a cross sectional view of a semiconductor device during intermediate stages of manufacturing operations, according to some embodiments of the present disclosure. In FIG. 10E, a plurality of epitaxial features 950 are formed in each of the recesses R2 in the first device region 900A. As previously discussed in FIG. 7E, in epitaxial growth operation, when a sidewall of the isolation region is exposed by a recess proximal to a dummy gate, the epitaxial feature may not effectively grow along a surface of isolation region material (such as oxide layer that can be utilized as shallow trench isolation or LOCOS), thus causing an undersized epitaxial feature and/or a non-uniform top surface of the epitaxial feature. Referring back to FIG. 10A and FIG. 10D, therefore by virtue of having a dummy gate 911 covering a portion of the isolation region 921 and a portion of the active regions 901A/901B, the sidewalls of the isolation region 921 are free from being exposed by the recesses R2. Therefore, during the operation of epitaxial growth, the epitaxial features 950 are free from being in direct contact with the isolation region 921. Alternatively stated, a portion 900SA of a material of the substrate 900S (such as silicon layer) is spacing between the isolation region 921 and a sidewall SW (shown in FIG. 10D) of the recess R2 subsequent to the formation of the recesses R2. Such portion 900SA of the substrate 900S is under a coverage of vertical projection area of the dummy gates 911. In some embodiments, each of the recess R2 includes inclined surfaces, and a portion of the recess R2 is under a coverage of a vertical projection area of the dummy gates 911 or the gates 912.

Figure 10F:
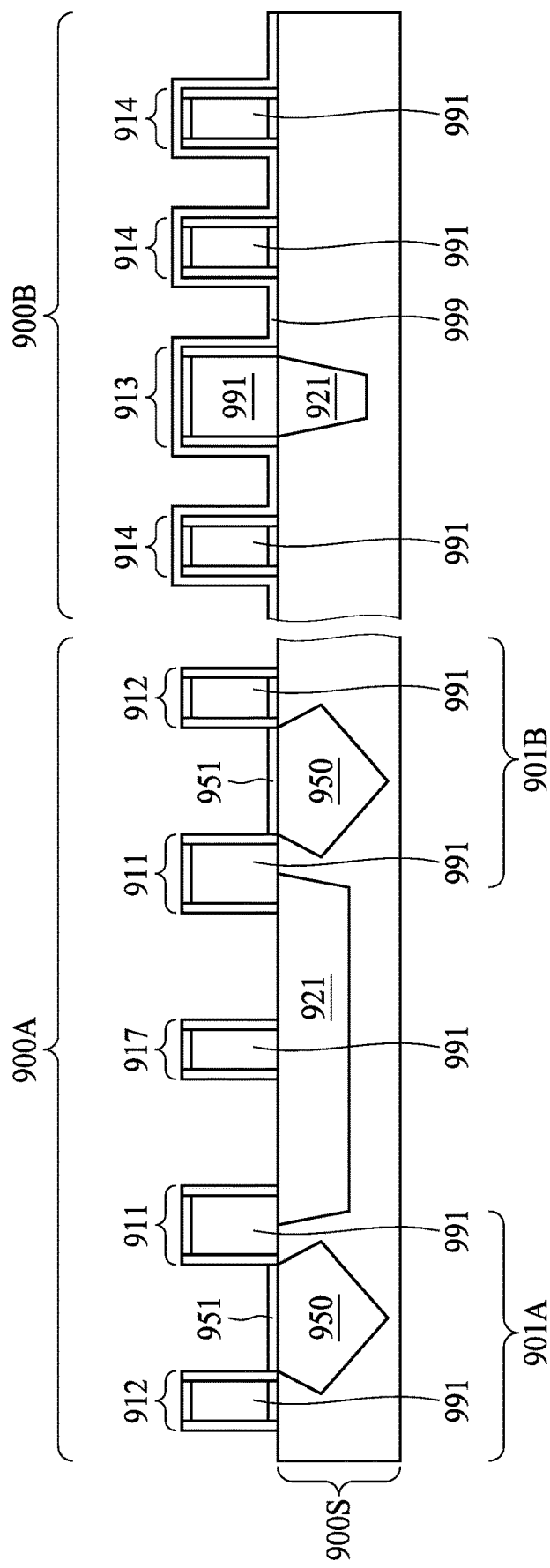

Referring to FIG. 10F, FIG. 10F is a cross sectional view of a semiconductor device during intermediate stages of manufacturing operations, according to some embodiments of the present disclosure. A silicide layer 951 is formed over the epitaxial features 950. An implanting operation of a dopant having a first conductivity type can be performed over the epitaxial features 950 and the silicide layer 951 in the first device region 900A, while the second device region 900B is covered by the mask layer 999, to achieve certain electrical properties in the first device region 900A. Since the volume of the epitaxial features 950 and a profile of a top surface of the epitaxial features 950 may be improved, a surface of substrate 900S being exposed during the implanting operation us deceased, thus the leakage issue may be improved. Comparing to the comparative embodiments discussed in FIG. 1A to FIG. 3, the devices in the first device region 900A has improved symmetric cross-section profile and a more uniformed electrical properties. Furthermore, conductive contacts (not shown) can be formed over the epitaxial features 950, and by implementing the aforementioned configurations and techniques, the issue of failure to connect a bottom surface of the conductive contact and a top surface of the epitaxial features 950 may be alleviated.

Figure 10G:
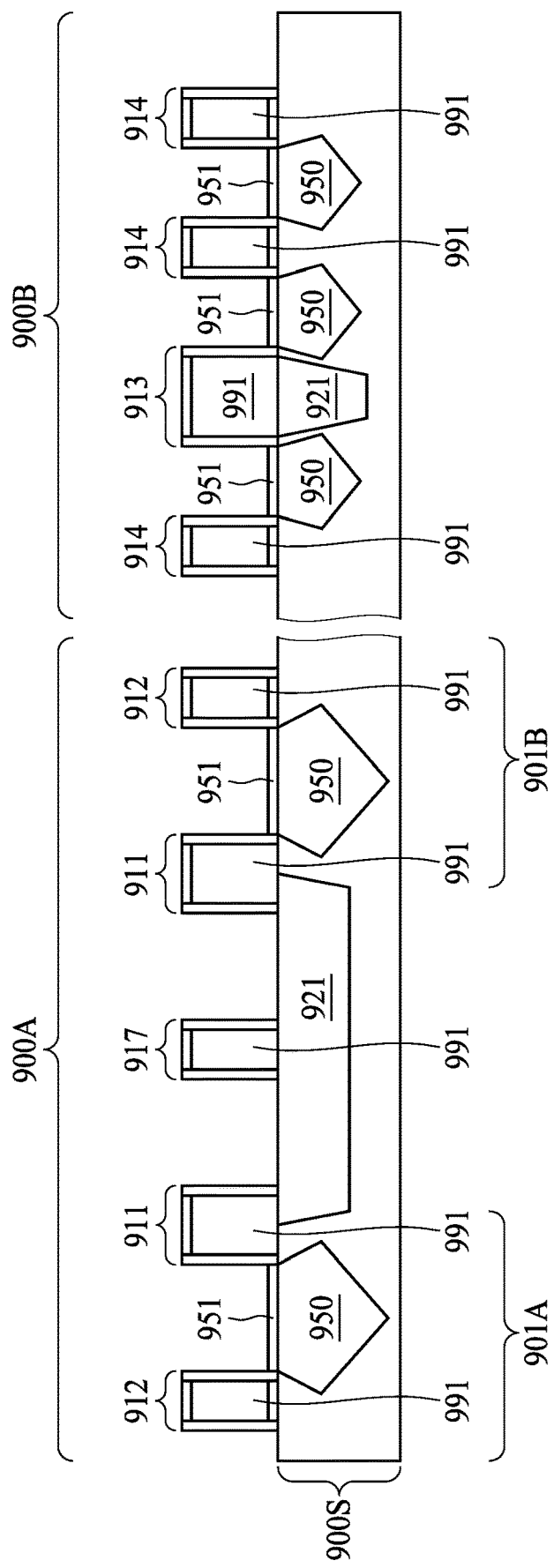

Referring to FIG. 10G, FIG. 10G is a cross sectional view of a semiconductor device during intermediate stages of manufacturing operations, according to some embodiments of the present disclosure. The mask layer 999 in the second device region 900B is removed. The second device region 900B can be implanted with dopant having a second conductivity type different from the first conductivity type. Thus, the first device region 900A and the second device region 900B can be defined as different types of device regions. For example, the first device region 900A is formed as PMOS region and the second device region is formed as NMOS region, or vice versa. Thereby, a device 900 including the first device region 900A and the second device region 900B is formed.

Optionally, similar techniques discussed in FIG. 7D to FIG. 7F or FIG. 10D to FIG. 10F can be implemented in the second device region 900B.

It is found that the epitaxial features adjacent to the isolation region may not be properly formed when a surface of an isolation region becomes part of the growth surface for the epitaxial features, thereby the volume of the formed epitaxial features may be less than desired. The volume of the epitaxial features is related to device performance, thus, the problem of epitaxial growth may lead to worse device performance. Furthermore, the asymmetric physical shape may lead to asymmetric electrical properties over the entire epitaxial features; a height of the epitaxial features adjacent to the isolation region may be lower than the other epitaxial features, and a conductive contact formed thereabove may not be properly contacting the epitaxial features 131 adjacent to the isolation region; and when performing an implanting operation (for example, source/drain pickup implant), some dopant that should be implanted in the epitaxial features may end up being implanted into silicon layer in active regions, and such phenomenon may cause leakage issue due to undesired dopant distribution. Accordingly, the configuration of the dummy gates 611 in FIG. 6A to FIG. 7G, or, the configuration of the dummy gates 911 in FIG. 9A to FIG. 10G may help preventing the exposure of underlying isolation region to be exposed prior to forming an epitaxial feature. Therefore, the epitaxial feature can be grown along a silicon surface and thereby achieving desired volume and shape.

In addition, the implantation of the dummy gates 611 and 911 (or auxiliary dummy gates 917 if presented) may be disposed for alleviating diffraction issue and improve lithography pattern density uniformity. It should be noted that, it is common that a design rule along with a design layout provided by designer cannot be radically changed by manufacturer. Therefore, by adjusting a local property of light with lithographic techniques, a size of certain fabricated dummy gates, such as dummy gates 611 (shown in FIG. 6A to FIG. 7G) and 911 (shown in FIG. 9A to FIG. 10G), can be enlarged in secondary direction SD in a single patterning operation without radically changing their positions. Although the separation between a dummy gate and a gate adjacent thereto may be narrower than a separation between two adjacent gates, however, the benefit of enlarging a size of the dummy gate 611 may be a more prominent factor for device performance than slightly trading-off the lithography pattern density uniformity related to changing a size of such dummy gate. Such adjustment may be able to comply with advanced design rules provided by designers while alleviating the aforementioned issues.

In FIG. 6A to FIG. 7G, by virtue of having a dummy gate 611 being wider and covering the portion of the isolation region 621 underneath (i.e. the portion 621a as shown in FIG. 6A), the sidewalls of the isolation region 621 are free from being exposed by the recesses R1. Therefore, during the operation of epitaxial growth, the epitaxial features 650 are free from being in direct contact with the isolation region 621.

In FIG. 9A to FIG. 10G, the implementation of auxiliary dummy gates 917 can help alleviating diffraction issue when a distance between two dummy gates 911 across two sides of isolation region 921 is greater than desired and/or it is required to have a wider isolation region 921 between two active regions 901A and 901B.

Also, by incorporating the mask layer 699 (shown in FIG. 6A to FIG. 7G) or 999 (shown in in FIG. 9A to FIG. 10G) into such single patterning operation, separated device regions can be implemented with dopants having different conductivity types to achieve desired device functions.

Some embodiments of the present disclosure provide a semiconductor device, including a semiconductor device, including a substrate, a first active region in the substrate, a second active region in the substrate and adjacent to the first active region, an isolation region in the substrate and between the first active region and the second active region, and a dummy gate overlapping with the isolation region, wherein an entire bottom width of the dummy gate is greater than an entire top width of the isolation region.

Some embodiments of the present disclosure provide a semiconductor device, including a substrate, a first active region in the substrate, a second active region in the substrate and adjacent to the first active region, an isolation region in the substrate and between the first active region and the second active region, a first gate overlapping with the isolation region, and a second gate over the first active region, wherein an entire bottom width of the first gate is greater than an entire bottom width of the second gate.

Some embodiments of the present disclosure provide a method for forming a semiconductor device, including providing a substrate, forming an isolation region in the substrate, forming a first gate overlapping with the isolation region, forming a second gate adjacent to the first gate, and forming a recess in the substrate and between the first gate and the second gate, wherein the recess is spaced apart from a sidewall of the isolation region.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A method for forming a semiconductor device, comprising:
    forming an isolation region in a substrate, wherein the isolation region has a first length along a first direction;
    forming a first active region in the substrate;
    forming a second active region in the substrate, the second active region being adjacent to the first active region along a second direction substantially orthogonal to the first direction, wherein:
        a first portion of the isolation region is between the first active region and the second active region;
        the first active region has a first edge adjacent to the first portion of the isolation region; and
        the second active region has a second edge adjacent to the first portion of the isolation region;
    covering the first edge of the first active region and the second edge of the second active region by forming a dummy gate structure over the substrate, wherein the dummy gate has a second length along the first direction;
    forming a first gate over the first active region, wherein the first gate has a third length along the first direction, and the third length is substantially equal to the second length and less than the first length;
    forming a second gate over the second active region;
    forming a mask layer over the second gate;
    forming a recess adjacent to the first gate after forming the mask layer and covering the first edge of the first active region and the second edge of the second active region; and
    forming an epitaxial feature in the recess.

2. The method of claim 1, wherein the dummy gate structure and the first gate are formed by a single patterning operation.

3. The method of claim 1, wherein the dummy gate structure is wider than the first gate.

4. The method of claim 1, wherein the epitaxial feature is free from contacting the isolation region.

5. The method of claim 4, further comprising forming the silicide layer over the epitaxial feature.

6. A method for forming a semiconductor device, comprising:
    forming a first device region and a second device region different from the first device region, wherein forming the first device region comprises:
        forming an isolation region in a substrate, wherein the isolation region has a first length along a first direction;
        forming a first active region in the substrate;
        forming a second active region in the substrate, wherein a first portion of the isolation region is between the first active region and the second active region;
        forming a functional gate over the substrate overlapping the first active region, wherein the functional gate comprises a functional gate portion with a second length along the first direction and a first width along a second direction substantially orthogonal to the first direction, and the second length is less than the first length;
        forming a dummy gate over the substrate, wherein the dummy gate overlaps with the isolation region, the dummy gate comprises a dummy gate portion with a second width along the second direction being substantially greater than the first width, and an entire bottom width of the dummy gate is greater than an entire top width of the first portion of the isolation region along the second direction;
        forming a mask layer over the second device region; and
        forming a recess at the first active region after forming the mask layer over the second device region.

7. The method of claim 6, wherein the entire first portion of the isolation region is under a vertical projection of the dummy gate.

8. The method of claim 6, wherein a first portion of the dummy gate covers an edge of the first active region, and a second portion of the dummy gate covers an edge of the second active region.

9. The method of claim 6, wherein the recess is at a position between the first gate and the dummy gate, and a portion of the substrate is between a sidewall of the recess and a sidewall of the first portion of the isolation region.

10. The method of claim 6, further comprising forming an epitaxial feature in the recess.

11. A method for forming a semiconductor device, comprising:
    forming an isolation region in a substrate;
    forming a first active region in the substrate;
    forming a second active region in the substrate, wherein:
        a first portion of the isolation region is between the first active region and the second active region;
        the first active region has a first edge adjacent to the first portion of the isolation region; and
        the second active region has a second edge adjacent to the first portion of the isolation region;
    covering the first edge of the first active region and the second edge of the second active region, comprising:
        forming a first dummy gate over the first edge of the first active region; and
        forming a second dummy gate over the second edge of the second active region;
    forming a first gate over the first active region;
    forming at least one auxiliary dummy gate between the first dummy gate and the second dummy gate;
    forming a recess adjacent to the first gate after covering the first edge of the first active region and the second edge of the second active region; and
    forming an epitaxial feature in the recess.

12. The method of claim 11, wherein covering the first edge of the first active region and the second edge of the second active region comprises:
    forming a first dummy gate over the substrate, wherein the entire first portion of the isolation region is under a projection area of the first dummy gate.

13. The method of claim 11, wherein the entire auxiliary dummy gate is within the isolation region from top view perspective.

14. The method of claim 11, wherein the auxiliary dummy gate is formed prior to forming the recess.

15. The method of claim 11, further comprising forming a second gate over the second active region.

16. The method of claim 15, further comprising forming a mask layer over the second gate prior to forming the recess.

17. The method of claim 6, wherein the second active region is surrounded by the isolation region, and the functional gate is entirely within an area defined by an outer boundary of the isolation region from a top view.

18. The method of claim 10, further comprising removing the mask layer after forming the epitaxial feature.

19. The method of claim 6, wherein the formation of the first gate portion and the second gate portion comprises performing a single patterning operation.

20. The method of claim 6, wherein the functional gate further comprises a first pair of spacers surrounding the functional gate portion, and the dummy gate further comprises a second pair of spacers surrounding the dummy gate portion.

* * * * *